United States Patent
Strimel et al.

(10) Patent No.: US 10,558,738 B1
(45) Date of Patent: Feb. 11, 2020

(54) COMPRESSION OF MACHINE LEARNED MODELS

(71) Applicant: Amazon Technologies, Inc., Seattle, WA (US)

(72) Inventors: Grant Strimel, Presto, PA (US); Sachin Grover, Tempe, AZ (US)

(73) Assignee: AMAZON TECHNOLOGIES, INC., Seattle, WA (US)

( * ) Notice: Subject to any disclaimer, the term of this patent is extended or adjusted under 35 U.S.C. 154(b) by 0 days.

(21) Appl. No.: 16/355,338

(22) Filed: Mar. 15, 2019

(51) Int. Cl.
| | |
|---|---|
| *G06F 17/22* | (2006.01) |
| *H03M 7/42* | (2006.01) |
| *G06F 16/901* | (2019.01) |
| *G06N 7/00* | (2006.01) |
| *G10L 15/26* | (2006.01) |
| *G06N 20/00* | (2019.01) |

(52) U.S. Cl.
CPC ...... *G06F 17/2276* (2013.01); *G06F 16/9014* (2019.01); *G06N 7/005* (2013.01); *G06N 20/00* (2019.01); *G10L 15/26* (2013.01); *H03M 7/42* (2013.01)

(58) Field of Classification Search
CPC . G06F 17/2276; G06F 16/9014; G06N 7/005; G06N 20/00; G10L 15/26; H03M 7/42

USPC .......................................... 341/87, 106, 67
See application file for complete search history.

(56) References Cited

U.S. PATENT DOCUMENTS

| | | | |
|---|---|---|---|
| 10,013,974 B1 | 7/2018 | Filimonov et al. | |
| 10,409,916 B2 * | 9/2019 | Sanders | G06F 17/28 |
| 10,410,107 B2 * | 9/2019 | Romero | G06N 3/006 |
| 10,410,351 B2 * | 9/2019 | Lin | G06T 7/11 |
| 10,412,225 B2 * | 9/2019 | Jandwani | H04M 3/56 |

* cited by examiner

*Primary Examiner* — Brian K Young
(74) *Attorney, Agent, or Firm* — K&L Gates LLP

(57) ABSTRACT

Devices and techniques are generally described for compression of natural language processing models. A first index value to a first address of a weight table may be stored in a hash table. The first address may store a first weight associated with a first feature of a natural language processing model. A second index value to a second address of the weight table may be stored in the hash table. The second address may store a second weight associated with a second feature of the natural language processing model. A first code associated with the first feature and comprising a first number of bits may be generated. A second code may be generated associated with the second feature and comprising a second number of bits greater than the first number of bits based on a magnitude of the second weight being greater than a magnitude of the first weight.

20 Claims, 11 Drawing Sheets

US 10,558,738 B1

COMPRESSION OF MACHINE LEARNED MODELS

BACKGROUND

Automatic speech recognition (ASR) combined with language processing techniques may enable a computing device to retrieve and process commands from a user based on the user's spoken commands. In some systems, speech recognition and/or voice-controlled devices activate upon detection of a spoken "wake-word". Natural language processing is used to translate the spoken requests into semantic interpretations of the spoken command. Natural language processing is performed using probabilistic machine learning models that typically require relatively large amounts of computing resources such as memory and processing resources.

DETAILED DESCRIPTION

Figure 1:
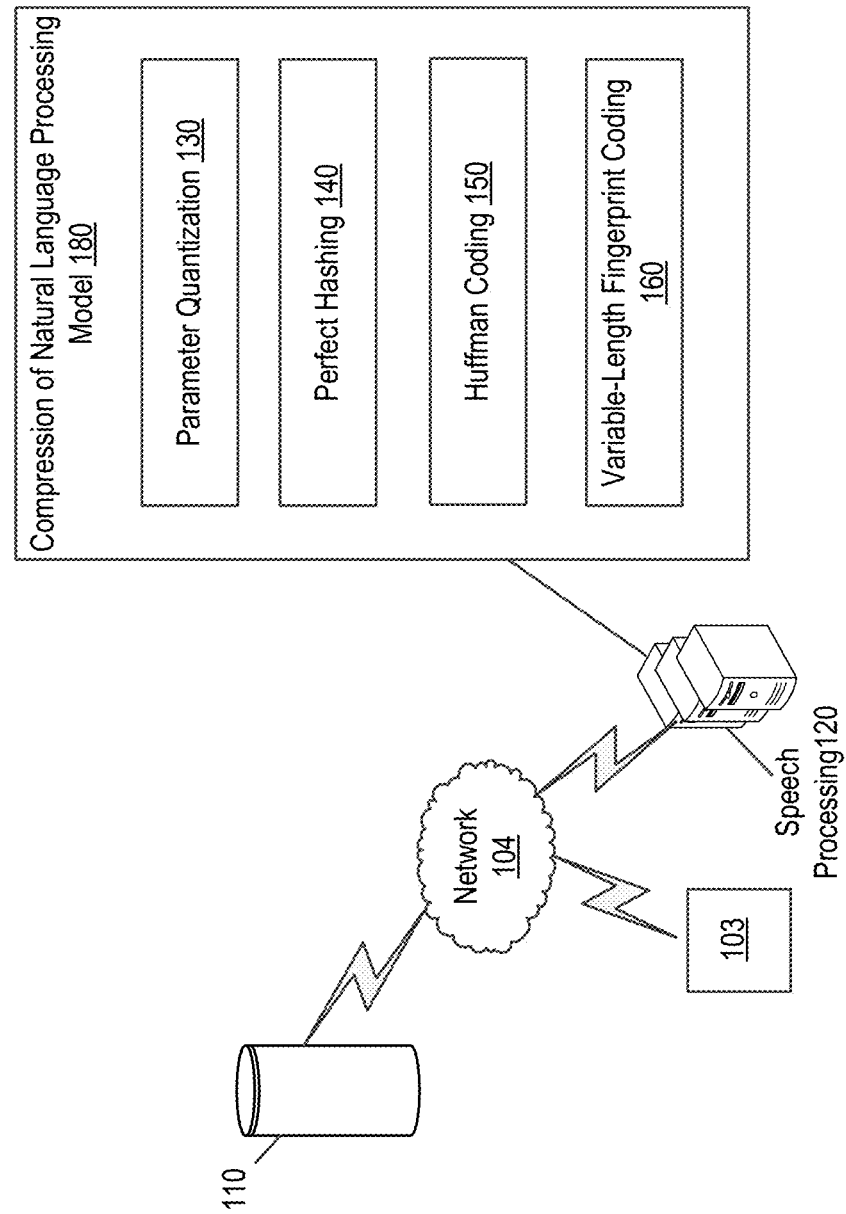
FIG. 1 is a diagram of an example system configured to perform compression of a natural language processing model, according to various embodiments of the present disclosure.

In the following description, reference is made to the accompanying drawings that illustrate several examples of the present invention. It is understood that other examples may be utilized and various operational changes may be made without departing from the spirit and scope of the present disclosure. The following detailed description is not to be taken in a limiting sense, and the scope of the embodiments of the present invention is defined only by the claims of the issued patent.

Automatic speech recognition (ASR) is a field of computer science, artificial intelligence, and linguistics concerned with transforming audio data associated with speech into text data representative of that speech. Natural language understanding (NLU) is a field of computer science, artificial intelligence, and linguistics concerned with enabling computers to derive meaning from text input containing natural language, resulting in specific executable commands or other type of instructions. Text-to-speech (TTS) is a field of computer science, artificial intelligence, and linguistics concerned with enabling computers to output synthesized speech. ASR, NLU, and TTS may be used together as part of a speech processing system.

Spoken language understanding (SLU) is a field of computer science, artificial intelligence, and/or linguistics that receives spoken language as an input, interprets the input, and generates executable commands that may be executed by one or more other computing devices and/or speech processing components. In various examples, spoken language understanding may be a combination of ASR systems and NLU systems, while in other examples, spoken language understanding may be a single model or other type of component effective to perform the functions of both ASR and NLU or otherwise take audio data as an input and output executable commands or other types of instructions representing the meaning of the audio data. In various further examples, TTS may receive text input and may generate audio representing the input text. For example, TTS may receive input text data (e.g., text data representing a response to a user utterance) and may generate output audio data representing the text.

Speech processing may be used in a variety of contexts, including in speech-processing enabled devices (e.g., devices employing voice control and/or "voice assistants") and/or systems. Examples of speech-processing systems and/or voice-enabled personal assistants include the Siri system from Apple Inc. of Cupertino, Calif., voice-enabled actions invoked by the Google Assistant system from Google LLC of Mountain View, Calif., Dragon speech recognition software from Nuance Communications of Burlington, Mass., the Cortana system from Microsoft of Redmond, Wash., voice-enabled skills invoked by the Alexa system from Amazon.com, Inc. of Seattle, Wash., etc.

Speech-processing enabled devices may include microphones (e.g., far-field microphone arrays) used to transform audio into electrical signals. Speech processing may then be performed, either locally by the speech-processing enabled device, by one or more other computing devices communicating with the speech-processing enabled device over a network, or by some combination of the speech-processing enabled device and the one or more other computing devices. In various examples, speech-processing enabled devices may include and/or may be configured in communication with speakers and/or displays effective to output information obtained in response to a user's spoken request or command, or to output content that may be of interest to one or more user's (e.g., determined using the content recommendation models described herein).

A speech-controlled computing system may respond to user utterances by outputting content and/or performing one or more other actions, such as playing music, providing information, calling a taxi, displaying an image, etc. Generally, input data received by the various speech processing systems and components described herein may comprise natural language input data. Natural language input data may be in the form of audio data representing spoken user utterances (e.g., a spoken user request), text data (e.g., a request typed by a user), gesture data (e.g., data representing a user shaking their head while wearing ear buds, making a hand gesture, etc.), and/or some combination of text data, gesture data, and/or audio data.

Speech-processing systems may be configured with multiple applications (e.g., thousands, tens of thousands, or more applications) that can be used to potentially respond to a user request. Applications may be referred to herein as "skills". For example, a speech-processing system may include music skills, video skills, calendar skills, timer skills, general knowledge answering skills, game skills, device control skills, etc. As described herein, skills receive NLU data comprising slot data and/or intent data and are configured to determine one or more actions based on the slot data and/or intent data. Examples of such actions may include text to be processed into output audio data (e.g., synthetic speech) via a text-to-speech (TTS) component, an executable command effective to play a song from a music service, a movie from a movie service, or the like, an executable command effective to cause a system to perform an action (e.g., turning lights on/off, controlling an appliance, purchasing an item, etc.).

The invocation of a skill by a user's utterance may include a request that an action be taken. The number of applications/skills continues to grow and the rate of growth is increasing as developers become more accustomed to application programming interfaces (APIs) and application development kits provided for the voice service. Rule-based approaches and/or predefined utterance matching have been used in some systems for processing requests spoken in a certain format to invoke a particular application. In other examples, as described further below, skills may use probabilistic NLU based machine learned models to determine an action. Skill NLU models may be loaded into memory of a speech-processing system when the skill is invoked via a user utterance. In at least some examples, a "skill," "skill component,", "speech-processing skill", and the like may be software running on a computing device, similar to a traditional software application running on a computing device. Such skills may include a voice user interface in addition to or instead of, in at least some instances, a graphical user interface, smart home device interface, and/or other type of interface.

Voice-assistants with NLU models are increasing in popularity and there is a growing demand to support availability of speech processing in many contexts with a wide range of functionality. For example, there is a desire to implement natural language processing in systems that may not have persistent internet access. Some examples of such systems may include vehicle computing devices and/or other computing devices that may experience intermittent internet access or no internet access. Thus, instead of sending a user's request over an internet connection to a cloud-based NLU system for processing, local NLU implementation involves executing the NLU locally on the hardware associated with the relevant device. Current backend system NLU models have relatively large memory footprints making such models less convenient for deployment by many current client-side systems without appropriate compression. Also, compression of the models may result in cost savings being realized in backend deployments.

In addition to such "offline" systems, speech-processing skills include NLU models that extend the functionality of the main NLU models of the larger speech-processing system with which the skills interface. Since speech-processing systems interface with a large number of skills, the NLU models of individual skills may be loaded on demand, as needed to process user requests. If the skill NLU models sizes are large, loading the skill NLU models into memory may add latency to utterance recognition. Thus, small memory footprint NLU models may have significant impact on low-latency NLU response and result in an improved user experience.

As described in further detail below, NLU models may comprise speech-processing domain classification (DC), intent classification (IC), and named-entity recognition (NER) models. Domain classification may predict the general speech-processing domain class of a user utterance such as "Music," "Shopping," "Movies," etc. Intent classification may predict the user intent within a domain such as a PlayMusicIntent representing a user instruction to begin playback of a song, for example. Other examples intents may include a MovieShowTimesIntent, a BuyItemIntent, etc. NER recognizes domain-specific named entities such as artist names and/or song names for the Music domain, movie name and/or actor name for the Movies domain, etc.

Described herein are various techniques that may be used to compress machine learned models, such as statistical NLU models that may be used for domain classification, intent classification, and/or named-entity recognition. In various examples, n-gram maximum entropy (MaxEnt) models may be used for DC and IC. In some examples, n-gram conditional random fields models (CRF) may be used for NER. However, the various compression techniques described herein may be generally applicable to any model types including a large number of features. Advantageously, compression of NLU models may allow NLU processing to be locally performed on "offline" or "hybrid" devices. Hybrid devices may be devices having a combination of back-end speech processing capability and local speech processing capability. In various examples, the local speech processing capability of hybrid devices may allow the hybrid devices to process a number of spoken commands locally with a reduced latency relative to an utterance that is processed by a backend system accessible over a network. For example, a hybrid device may process the user utterance "Turn on the light" locally, while a request to play music may be processed by a backend speech processing component. Additionally, the latency of loading skill NLU models into a cloud-based speech-processing system may be reduced.

Storage and/or use of data related to user utterances may be controlled by a user using privacy controls associated with a speech-processing enabled device and/or a companion application associated with a speech-processing enabled device. Accordingly, users may opt out of storage of personal and/or contextual data and/or may select particular types of personal and/or contextual data that may be stored while preventing aggregation and storage of other types of personal and/or contextual data. Additionally, aggregation, storage, and use of personal and/or contextual information, as described herein, may be compliant with privacy controls, even if not technically subject to them, to bolster user trust. For example, personal, contextual, and other data described herein may be treated as if it fell under acts and regulations, such as the Health Insurance Portability and Accountability Act (HIPAA) and the General Data Protection Regulation (GDPR), even if it does not actually fall under these acts and regulations.

FIG. 1 is a diagram of an example system configured to perform compression of a natural language processing model, according to various embodiments of the present disclosure.

As shown in FIG. 1, the system 100 includes a speech-processing enabled device 110. Generally, a speech-processing enabled device 110 may be a device that allows a user to interact with a speech-processing system. In some examples, the speech processing system may be implemented in whole or in part by the speech-processing enabled device (e.g., using computing resources of speech-processing enabled device 110). However, in some other examples, the speech-processing system may be implemented in whole or in part by other speech-processing computing device(s) 120 that are configured in communication with speech-processing enabled device 110 (e.g., over network 104). In various examples, the compression techniques described herein may allow NLU models to be stored and executed locally (e.g., by one or more processors and/or memories local to speech-processing enabled device 110 and/or another device). Further, as previously described, in some examples, the various compression techniques described herein may reduce an amount of latency required to load an NLU model (e.g., a skill NLU model) into a memory of a speech-processing system, such as a speech-processing system implemented by speech-processing computing device(s) 120. In various examples, speech-processing computing device(s) 120 and/or one or more other computing devices and/or a system of computing devices may be effective to perform the various compression techniques for machine learned models described herein.

Speech-processing enabled device 110 may comprise speakers and audio circuitry effective to output audio. Additionally, speech-processing enabled device 110 may comprise one or more microphones effective to capture audio, such as spoken user utterances. In various examples, speech-processing enabled device 110 may include a display effective to display images and/or video data. However, in some other examples, speech-processing enabled device 110 may not include an integrated display. Speech-processing enabled device 110 may include communication hardware effective to allow speech-processing enabled device 110 to communicate with one or more other computing devices over a network 104. In various examples, network 104 may represent a local area network (LAN) and/or a wide area network (WAN) such as the internet. Speech-processing enabled device 110 may be effective to communicate over network 104 with speech-processing computing device(s) 120. As described in further detail below, speech-processing computing device(s) 120 may form a speech processing system that may perform various speech-processing techniques in order to semantically interpret and/or perform actions in response to user speech detected by speech-processing enabled device 110. Non-transitory computer-readable memory 103 may store instructions effective to program at least one processor of speech-processing computing device(s) 120 and/or some other computing device(s) to perform one or more techniques of compression of natural language processing model 180. In various examples, memory 103 and/or another memory may store one or more of the various data structures comprising the compressed NLU model (sometimes referred to as a "compressed natural language model" or a "compressed natural language processing model") after performing the compression of natural language processing model 180.

Although compression of natural language processing model 180 is depicted as being performed by speech-processing computing device(s) 120, any suitable computing device(s) may be used to perform the various compression techniques described herein.

Generally, a number of features may be defined for an NLU model. In various examples, the features may be learned during training. Generally, the features learned may be useful for the predictive capability of the model. For example, features may represent user utterances and/or data related to the user utterances. For example, a feature may be a string representing whether or not the bi-gram "play fun town" was present in a user utterance. In the current example, the feature may be a binary feature with a 1 representing that the bi-gram was present in the user utterance and a 0 representing that the bi-gram was not present. The feature may be associated with a parameter (sometimes referred to as a "weight"). Generally, in machine learning, weights are used as multipliers of a connection between a node in the current layer and a node in a connected layer for which the activation is being determined. During training, the weights of a predictive model (e.g., an NLU model) are updated to minimize a cost function using back propagation. Accordingly, after training is completed the weights of the model may be stored in memory. The trained NLU model may be used to make predictions based on input utterances from which features are extracted. Storing an NLU model in memory comprises storing each weight in association with the feature to which that weight pertains.

A machine learning model's memory footprint can be viewed as a large map from feature name to numeric weight. In NLU, there is typically a large universe U of potentially active or relevant features (such as English bi-grams). Of those features, a subset S, whose cardinality may be much smaller than that of U, may be the relevant parameters selected by the learning algorithm using feature selection methods. The relevant features and their corresponding weights are stored in the map while irrelevant parameters have 0 weight or are excluded from the model.

Storage of a weight in memory requires 64 bits for double precision or 32 bits for float precision. As described in further detail below, parameter quantization 130 may be used to reduce the number of bits required to store the weights (parameters) for an NLU model. For example, a set of representative values/cluster centers may be selected based on the weight values of the NLU model. In one example, weights may be clustered linearly. Linear clustering may comprise determining the minimum weight value and the maximum weight value of the machine learned model (e.g., the NLU model) and evenly spacing bins/clusters between the minimum and maximum weight values (based on the desired number of clusters). In various examples, a quantization weight for a particular bin/cluster may be the average weight value between the weight value at the start of the cluster/bin and the weight value at the end of the cluster/bin. In another example, the quantization weight for a particular bin/cluster may be the average value of all weights of the NLU model that are associated with the particular cluster/bin. In another example, K-means clustering may be used to determine representative values/cluster centers. However, linear clustering provides advantages when using Huffman encoding (or other prefix encoding), as due to the linear spacing of bins/clusters, some clusters will receive significantly more weights than others, depending on the original distribution of the weights for the NLU model. Accordingly, indices to common quantized weight values may be represented using fewer bits through prefix encoding (e.g., Huffman encoding, Rice encoding, etc.) After clustering, each weight of the NLU model may be assigned to the nearest value/cluster. When a parameter weight is accessed during runtime, the representative quantized value is used in place of the original value during the computation. Accordingly, instead of storing the original weight value, only the cluster identifier is stored for each entry in the map. For example, a single byte may be used as an index to a table that stores each cluster center value. Since a single byte is 8 bits, this represents a savings of 56 bits per weight for double precision and 24 bits per weight for float precision.

As described in further detail below, perfect hashing 140 may be used to implicitly store labels representing features of the NLU model instead of storing the explicit keys (e.g., strings representing bi-grams, etc.). Additionally, perfect hashing 140 may be used to avoid collisions whereby a key input into a hash function generates the same index number in an array as a different key input to the hash function. In perfect hashing, since all features of the NLU model are known in advance, a unique index to the array may be generated for each feature (e.g., a unique index for each element of the perfect hash table, wherein each element represents a respective feature of the NLU model). As used herein, an "element" of a table (e.g., a perfect hash table) and/or array refers to a portion of memory representing a unit of the data structure (e.g., one or more addresses in a non-transitory computer-readable memory or memories) that may store data and which is addressable via an index value of that element. As used herein, an "address" may refer to the address in memory of data (e.g., the address of an element of a hash table may refer to an address in a memory of the element). As used herein, an index refers to data identifying a particular element of a data structure (e.g., an array and/or table). Additionally, in various examples, the terms "array" and "table" may refer to data structures that may be stored in memory. In at least some examples, the terms array and table may be used interchangeably.

In various examples, the weights for a given NLU model may roughly follow a particular distribution. For example, in many NLU models the weights may roughly resemble a normal distribution with the majority of weights being centered around 0. For example, the majority of weights of an NLU model may be distributed within one standard deviation of 0. As described in further detail below, Huffman coding (or Rice coding) 150 may be used to encode index values of quantized weights appearing more frequently using fewer bits and index values of quantized weights appearing less frequently with more bits resulting in a net overall reduction in memory footprint for the NLU model. Index values of quantized weights encoded using Huffman coding (and/or Rice coding) may be referred to as prefix codes.

For a given input feature, a hash function of the perfect hash table (e.g., the perfect hash table generated using perfect hashing 140) is used to generate an index value to the perfect hash table. However, in some examples, the input feature (e.g., the input "key" extracted from an user utterance) may not correspond to any features (e.g., keys) of the original NLU model. Accordingly, the input feature may not correspond to any features that are represented in the perfect hash table. If strings representing the features were stored explicitly in the perfect hash table, the feature strings may be matched, thereby verifying that the input feature corresponds to the feature populating the perfect hash table. Accordingly, if the input key matches the key explicitly stored in the perfect hash table, the associated weight will be correct. However, explicit storage of string data requires a large amount of memory. Accordingly, perfect hashing 140 may instead implicitly store the feature string. For example, a minimal perfect hash function may associate an index of the perfect hash table with each defined feature of an NLU model. Each index, in turn, includes data referencing a data structure of quantized weights. However, during runtime, if a feature string that was not part of the NLU model (e.g., feature string data that is undefined with respect to the model) is passed to the minimal perfect hash function, the minimal perfect hash function will output a random index to the hash table, resulting in a random weight (e.g., a "false positive"). Accordingly, fingerprint data (e.g., a checksum) may be stored in association with each quantized weight. Fingerprint data (e.g., a fingerprint code data) may be determined by inputting the feature data (e.g., a string) into a fingerprint function that may output a fingerprint code generated using the input feature data. Fingerprint data may be used to identify a feature (e.g., the feature that was used to generate the fingerprint data) from among other features of the NLU model. The fingerprint code may be stored in association with each feature of the NLU model in the hash table (or separately in a fingerprint table, where each index of the perfect hash table is associated with a fingerprint code stored in the fingerprint table). The fingerprint function may be a hash function and/or a checksum effective to generate a fingerprint code based on the input feature data.

Accordingly, during runtime a feature extracted from an utterance may be passed to the fingerprint function to obtain the fingerprint code for the feature. The feature may be passed to the hash function to determine an index of the perfect hash table. As previously described, the fingerprint code associated with the index of the perfect hash table may be determined. If the fingerprint code associated with the index of the perfect hash table matches the fingerprint code calculated using the input feature, then the input feature is part of the NLU model and the quantized weight associated with the index is the correct weight value for that feature. Conversely, if the fingerprint codes differ, the feature is not part of the NLU model and a weight of 0 is assigned for the feature.

The fingerprint codes may be a static length of any desired number of bits. However, as previously described, a distribution of the weights in NLU models reveals that the majority of weights are close to zero. Accordingly, if a false positive leads to a feature that is not part of the original NLU model being associated with a quantized weight value that is close to zero, the overall predictive performance of the NLU model is not significantly affected. Conversely, if the false positive leads to a feature being associated with a large weight, predictive performance may be significantly impacted. Accordingly, this information can be leveraged to optimize the length (in terms of a number of bits) of fingerprint codes according to the weight's impact on predictive performance of the NLU model.

In various examples, variable-length fingerprint coding 160 may be used to vary the number of bits used in a fingerprint code based on how close the weight associated with the fingerprint code/feature is to zero. In general, more bits may be used for fingerprint codes that have large weight magnitudes, and fewer bits may be used for fingerprint codes that are close to zero. As described in further detail below, an optimization problem may be solved to determine the appropriate bit allocations for the variable length fingerprint codes.

Accordingly, for a given input feature that was not part of the original NLU model, the hash function may generate a random index value (random in the sense that the input feature does not correspond to any features of the original NLU model for which the perfect hash table was generated).

If the index value is associated with a weight that is close to zero, only a few bits may have been used for the fingerprint code for that weight (e.g., according to an optimization problem). Accordingly, there is a greater chance of error. For example, for a weight that is close to zero, a single bit may be used for a fingerprint code. Accordingly, there is a 50% chance that the calculated 1-bit fingerprint code for the input feature will match the 1-bit fingerprint code stored in association with the index/quantized weight value. However, even assuming that the fingerprint codes match and the quantized weight value is returned and used during prediction, the overall impact on prediction will be low, as the weight value returned from memory was close to zero.

In another example, if a weight has a relatively large magnitude (e.g., −89.3, 10, etc.) 10 bits may be used for a fingerprint code (note that the actual bit allocation may be determined using an optimization problem, as described below). In this example, there is a $\frac{1}{2^{10}}$ probability that the calculated 10-bit fingerprint code for the input feature will match the 10-bit fingerprint code stored in memory (assuming that the input feature was not part of the original model). Accordingly, the chance of such a large-magnitude weight being erroneously used during prediction is rendered exceedingly small through the allocation of a relatively large number of bits for the fingerprint code. As previously described, using a variable-length approach to encoding fingerprint codes reduces the overall memory footprint of the NLU model due to the distribution of weight values being clustered around zero. Accordingly, relatively small fingerprint codes may be used for the majority of weight values (as the majority of weight values are clustered around zero).

Figure 2A:
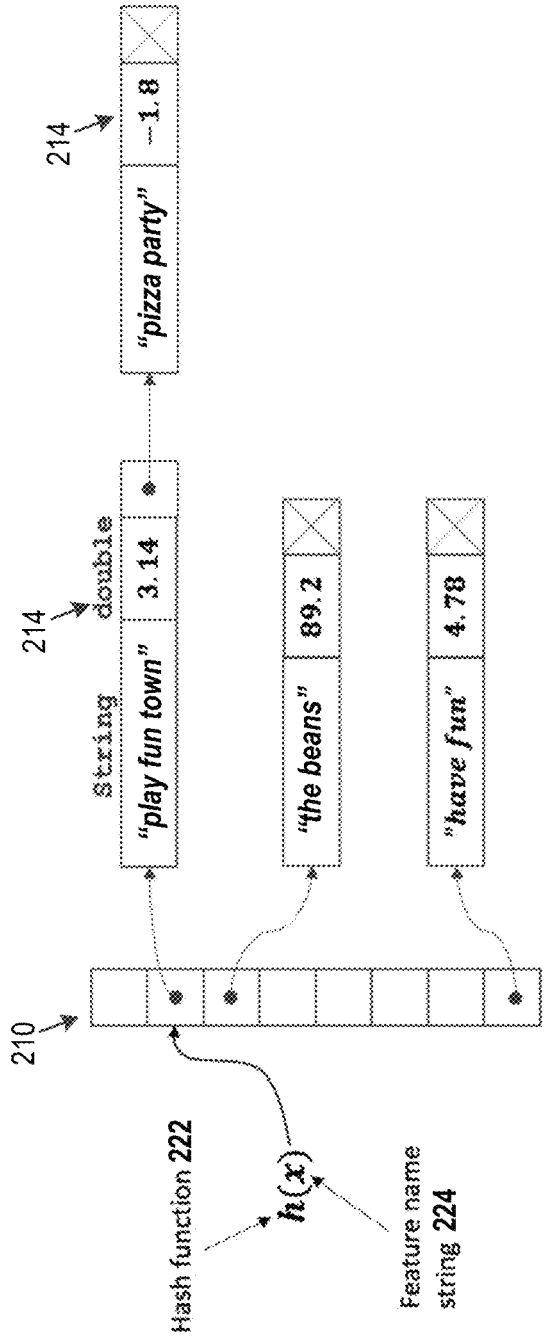
FIG. 2A depicts an example hash table including explicit storage of feature data and weights, according to various embodiments of the present disclosure.

FIG. 2A depicts an example hash table 210 including explicit storage of feature data and weights, according to various embodiments of the present disclosure. In the example hash table 210, string data representing English bi-grams are stored explicitly in the hash table 210 as features in association with double weight values 214. Perfect hashing has not been used in the example depicted in FIG. 2A, accordingly, as shown the second element in the hash table 210 is associated with two different features: "play fun town" and "pizza party". Accordingly, in various examples, the second element may include pointer data that points from the "play fun town" feature to the "pizza party" feature, or vice versa. Additionally, in hash table 210, double weight values 214 are stored in association with each explicit feature. As previously described, double weight values may use 64 bits each. Hash function 222 accepts feature name strings 224 as input and outputs an index to hash table 210. For index values of hash table 210 that are associated with more than one feature, the input feature name string 224 may be matched with the explicitly stored feature name string to determine the appropriate weight value 214.

Figure 2B:
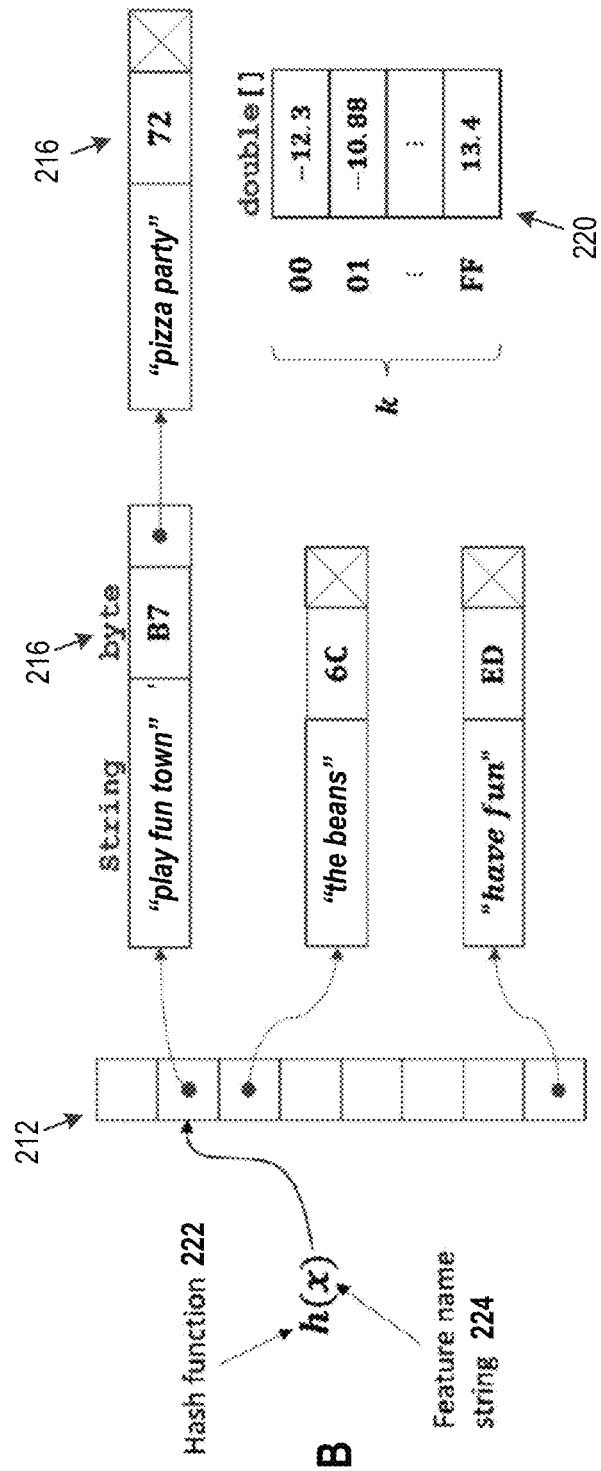
FIG. 2B depicts an example hash table including explicit storage of feature data and bytes referencing quantized weights in a quantized weight table, in accordance with various embodiments of the present disclosure.

FIG. 2B depicts an example hash table 212 including explicit storage of feature data and bytes referencing quantized weights in a quantized weight table 220, in accordance with various embodiments of the present disclosure. In hash table 212, double weight values have been replaced by byte index values 216. It should be appreciated that bytes are used for illustrative purposes only and some other amount of data quantum may instead be used. The byte index values 216 represent indexes to quantized weight table 220. Quantized weight table 220 stores representative weight value cluster centers k. Each weight value is assigned to the nearest cluster center k. In the example depicted in FIG. 2B, the quantized weights of quantized weight table 220 are stored as doubles. However, the byte index values 216 identifies the index in quantized weight table 220 where the quantized weight is stored for the particular feature. Various different methods for choosing the cluster centers of the weight values are known and may be employed. For example, linear quantization may be used to select the cluster centers (e.g., the quantized weights) by evenly partitioning the range between min and max weight values. Advantageously, linear quantization may round many smaller weight values to zero and may preserve larger weights that have greater effects on predictive performance. However, other methods of choosing quantization centers are known and may be employed in accordance with the various techniques described herein.

Figure 3:
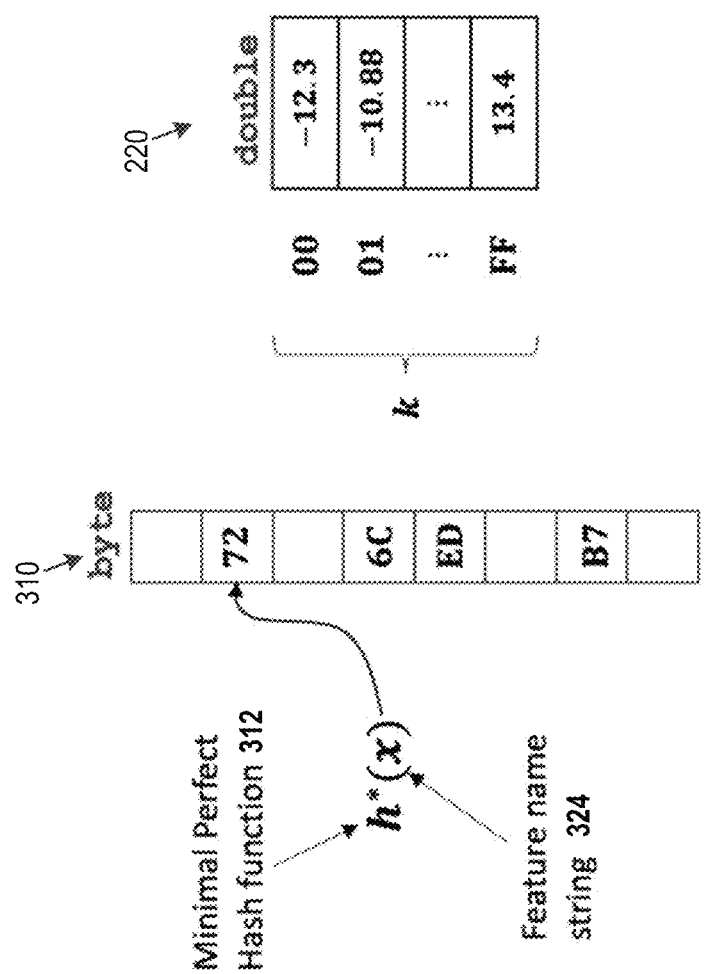
FIG. 3 depicts a minimal perfect hash function and perfect hash table implicitly storing feature data, in accordance with various embodiments described herein.

FIG. 3 depicts a minimal perfect hash function 312 and perfect hash table 310 implicitly storing feature data, in accordance with various embodiments described herein. Minimal perfect hash function 312 maps the set S of n keys into m elements of the perfect hash table 310 with no collisions. Using the minimal perfect hash function 312, an array is generated storing quantized indices. Each feature of the NLU model is associated with exactly one element of the array (e.g., perfect hash table 310). Advantageously, because each feature is associated with only one element, the explicit keys (e.g., the string feature data) need not be stored in the array. During runtime, an input feature (e.g., feature name string 324) is passed to the minimal perfect hash function 312. Minimal perfect hash function 312 outputs the index associated with the input feature. A lookup of perfect hash table 310 is performed using the index and the byte (or other data amount) index to the quantized weight table 220 is read. The byte index may be used to perform a lookup operation on quantized weight table 220 to determine the associated quantized weight. As described in further detail below, a variable length fingerprint code (e.g., feature identifying data) may be stored in association with each byte index (e.g., via direct storage of the fingerprint code or via a pointer to an array storing the fingerprint codes). Additionally, as described in further detail below, the byte indices stored in perfect hash table 310 may be encoded using Huffman encoding and/or Rice encoding to further reduce the memory footprint.

Figure 4A:
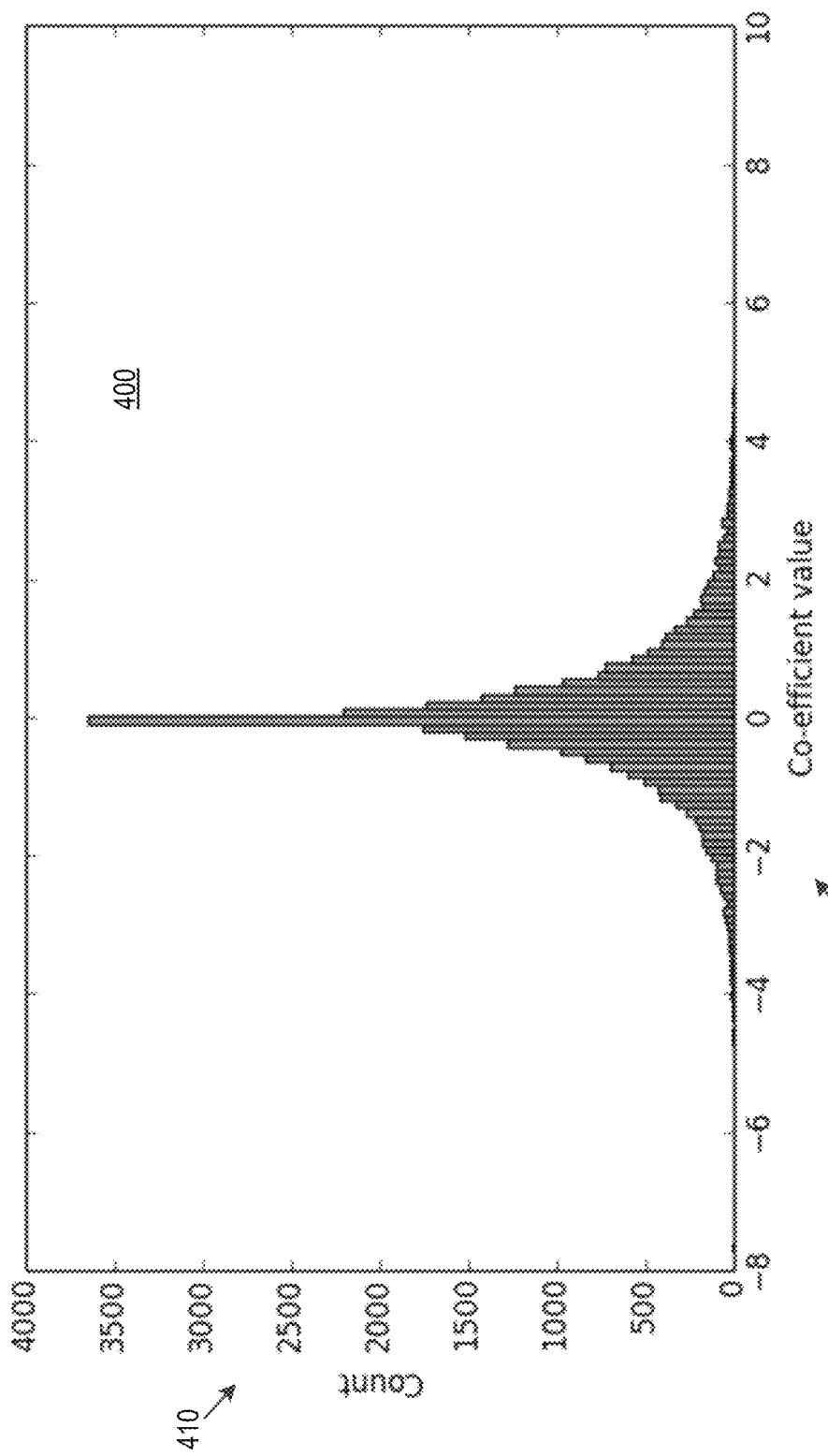
FIG. 4A depicts an example distribution of weight values of a natural language processing model, according to various embodiments described herein.

FIG. 4A depicts an example distribution 400 of weight values of a natural language processing model, according to various embodiments described herein. In distribution 400, the x-axis represents the weight value 420 and the y-axis represents the number of weights 410 (e.g., the number of occurrences of the weights in the NLU model). The weights in distribution 400 are roughly normally distributed with the majority of weights for the NLU model being close to zero (e.g., within +/−σ).

Figure 4B:
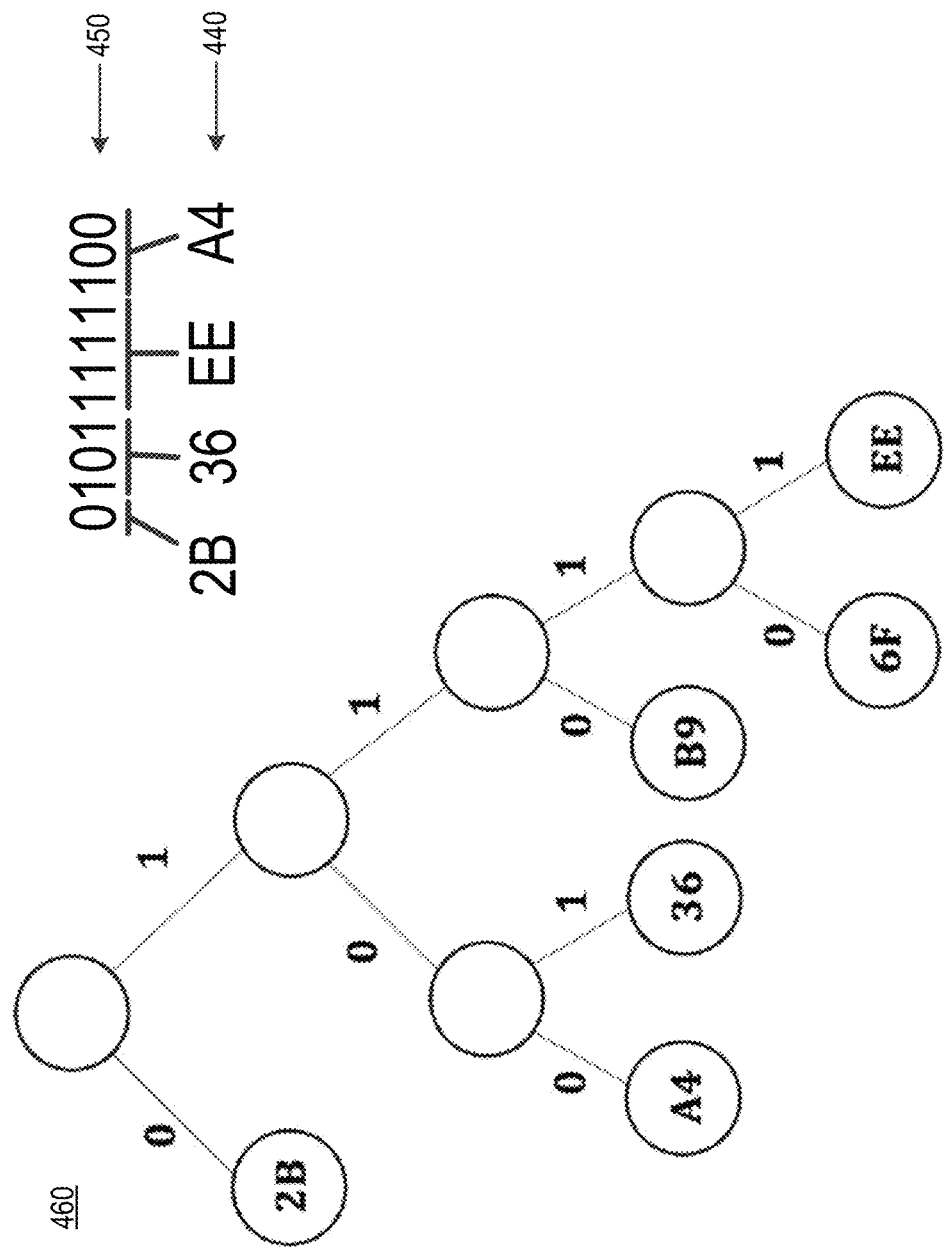
FIG. 4B depicts an example of use of Huffman encoding to encode weights of a natural language processing model, in accordance with various aspects of the present disclosure.

FIG. 4B depicts an example of use of Huffman encoding to encode weights of a natural language processing model, in accordance with various aspects of the present disclosure. Since the distribution 400 of weights in NLU models is typically heavily concentrated around 0, some quantized values are more frequent than others. Accordingly, less bits may be used to encode the indices of quantized weights that appear more frequently and more bits may be used to encode weights that appear less frequently.

FIG. 4B depicts a Huffman binary tree 460. Each leaf node (e.g., each circle) represents an object to be encoded and the path to a leaf node defines the object's prefix code. As shown in binary tree 460, a left branch is a 0 and a right branch is a 1. Byte indices 440 (e.g., indices into quantized weight table 220) stored in perfect hash table 310 are encoded using Huffman encoding based on the frequency with which the different indices are stored in the perfect hash table 310. In other words, byte indices 440 may be encoded based on the number of occurrences of the various indices in the perfect hash table 310. In the example depicted in FIG. 4B, byte 2B may appear frequently (e.g., byte 2B may be associated with a commonly used quantized weight by the NLU model). Accordingly, through Huffman encoding, byte 2B is encoded using a single bit prefix code. Similarly, other Huffman prefix codes 450 may use a number of bits based on the frequency of the byte indices 440. For example, byte 36 may be represented using a 3 bit prefix code, byte EE may be represented using a 4 bit prefix code, and byte A4 may be represented using a 3 bit prefix code. Accordingly, byte 2B may represent a quantized weight that is used more frequently than byte 36 or byte A4. Similarly, bytes 36 and A4 may be used more frequently than byte EE.

Figure 5:
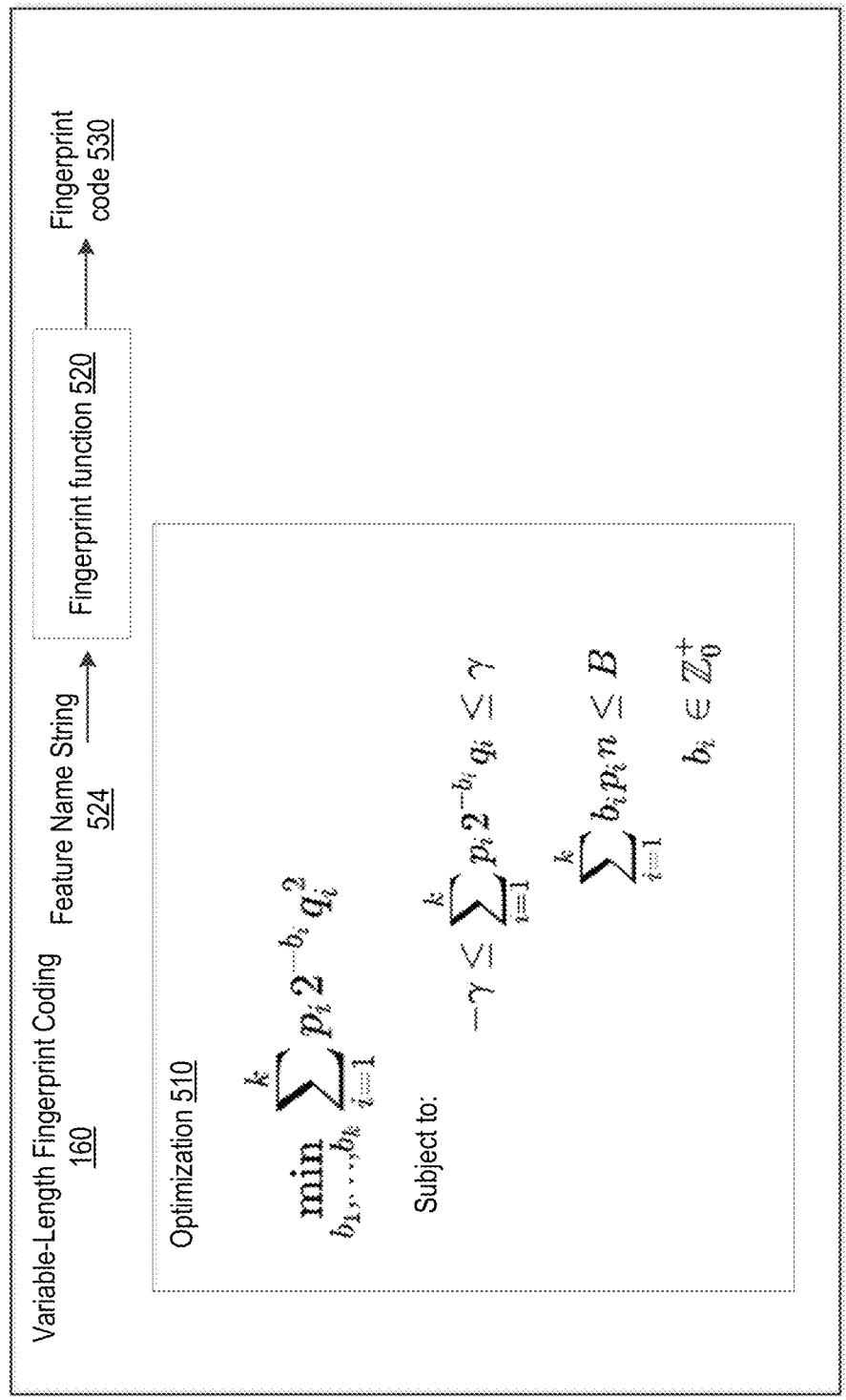
FIG. 5 depicts an example optimization problem that can be used to allocate bits to varied-length fingerprint codes, in accordance with various embodiments of the present disclosure.

FIG. 5 depicts an example optimization problem that can be used to allocate bits to varied-length fingerprint codes, in accordance with various embodiments of the present disclosure.

For a given input feature, minimal perfect hash function 312 of perfect hash table 310 may be used to generate an index value to the perfect hash table. However, in some examples, the input feature (e.g., the input "key" extracted from an user utterance) may not correspond to any features (e.g., keys) of the original NLU model (e.g., the NLU model as currently trained). Accordingly, the input feature may not correspond to any features that are represented in the perfect hash table 310. If strings representing the features were stored explicitly in the perfect hash table, the feature strings may be matched, thereby verifying that the input feature corresponds to the feature populating the perfect hash table. Accordingly, if the input key matches the key explicitly stored in the perfect hash table, the associated weight will be correct. However, explicit storage of string data requires a large amount of memory. Accordingly, perfect hashing 140 may instead implicitly store the feature string. For example, the minimal perfect hash function 312 may associate an index of the perfect hash table 310 with each defined feature of an NLU model. Each index, in turn, includes data referencing an element of quantized weight table 220. As described above in reference to FIGS. 4A, 4B, the data referencing the element of quantized weight table 220 (e.g., the byte indices of FIG. 3) may be encoded using Huffman encoding and/or Rice encoding so that reference data representing quantized weights that are more common are encoded using fewer bits relative to reference data representing less common quantized weights.

However, during runtime, if a feature string that was not part of the NLU model is input into minimal perfect hash function 312, the minimal perfect hash function 312 will output a "random" index to the hash table, resulting in a "random" weight (e.g., a "false positive"). Accordingly, fingerprint data (e.g., a checksum) may be stored in association with each element (e.g., each index) of the perfect hash table 310. Fingerprint data (e.g., a fingerprint code 530) may be determined by inputting the feature data (e.g., feature name string 524) into a fingerprint function 520 that may output a fingerprint code 530, generated using the input feature data. In some examples, the fingerprint codes and/or fingerprint data may be described as identifying data. In various examples, the fingerprint function 520 may be a hash function, checksum, and/or another function effective to generate unique identifiers for input feature data (e.g., feature name string 524). Fingerprint codes 530 may be stored in association with each feature of the NLU model in the perfect hash table 310 (or separately in a fingerprint table, where each element of the perfect hash table is associated with a fingerprint code 530 stored in the fingerprint table).

Accordingly, during runtime a feature extracted from an utterance may be passed to the fingerprint function 520 to obtain the fingerprint code 530 for the feature. The feature may be passed to the perfect hash function 312 to determine an index of the perfect hash table 310. As previously described, the fingerprint code 530 associated with the relevant element of the hash table (e.g., the element associated with the input feature data) may be determined. If the fingerprint code 530 associated with the index/element of the perfect hash table matches the fingerprint code 530 calculated using the input feature and fingerprint function 520, then the input feature is part of the NLU model and the quantized weight associated with the index is the correct weight value for that feature. Conversely, if the fingerprint codes do not match, the feature is not part of the NLU model and a weight of 0 is assigned for the feature.

The fingerprint codes may be a static length of any desired number of bits. However, as previously described, a distribution of the weights in NLU models reveals that the majority of weights are close to zero (FIG. 4A). Accordingly, if a false positive leads to a feature that is not part of the original NLU model being associated with a quantized weight value that is close to zero, the overall predictive performance of the NLU model is not significantly affected. Conversely, if the false positive leads to a feature being associated with a large weight, predictive performance may be significantly impacted. Accordingly, this information can be leveraged to optimize the length (in terms of a number of bits) of fingerprint codes according to the weight's impact on predictive performance of the NLU model.

In various examples, variable-length fingerprint coding 160 may be used to vary the number of bits used in a fingerprint code based on how close the weight associated with the fingerprint code/feature is to zero. In general, more bits may be used for fingerprint codes that have large weight magnitudes, and fewer bits may be used for fingerprint codes that are close to zero. An optimization problem may be solved to determine the appropriate bit allocation for the fingerprint codes. An example implementation of the solving of an optimization problem to allocate bits to vary the length of fingerprint codes is provided below. However, it should be appreciated that the example implementation described below is but one example of an optimization that may be used to allocate bits to varied length fingerprint codes. Other implementations are possible as will be appreciated by one having ordinary skill in the art.

An optimization problem may be solved to allocate bits to varied-length fingerprint codes according to how close an associated quantized weight is to 0.

TABLE 1

Definitions $q_i$ is the i-th quantized weight (e.g., cluster center), $i \in [k]$.
$Q_i = \{x \in S | x$ is quantized to cluster i at value $q_i\}$.

$p_i = \frac{|Q_i|}{n}$ = the probability of $x' \notin S$ perfect hashing to the same value of $x \in S$ with quantized weight $q_i$.

$b_i$ = number of bits allocated to each fingerprint code of those parameters with quantized weight $q_i$.
B = the total fingerprint code bit budget, total number of TABLE 1-continued Definitions fingerprint code bits to be allocated across all weights.
$\gamma$ = a small tolerance parameter (e.g., $10^{-7}$).

$$\min_{b_1,\ldots,b_k} \text{Var}[\Delta] \text{ subject to:}$$

$$-\gamma \leq E[\Delta] \leq \gamma$$

$$\sum_{i=1}^{k} b_i p_i n \leq B$$

$$b_i \in \mathbb{Z}_0^+$$

Noting that:

$$E[\Delta] = \sum_{i=1}^{k} p_i 2^{-b_i} q_i \text{ and}$$

$$\text{Var}[\Delta] = E[\Delta^2] - E[\Delta]^2$$

$$= \sum_{i=1}^{k} p_i 2^{-b_i} q_i^2 + \left(\sum_{i=1}^{k} p_i 2^{-b_i} q_i\right)^2$$

The following optimization problem may be solved to allocate bits to varied-length fingerprint codes according to the relative quantized weight magnitudes associated with the various features:

$$\min_{b_1,\ldots,b_k} \sum_{i=1}^{k} p_i 2^{-b_i} q_i^2$$

subject to:

$$-\gamma \leq \sum_{i=1}^{k} p_i 2^{-b_i} q_i \leq \gamma$$

$$\sum_{i=1}^{k} b_i p_i n \leq B$$

$$b_i \in \mathbb{Z}_0^+$$

Note that the second term of the variance function is left absent as the constraints enforce that it remains significantly small.

The above optimization problem allocates bits to fingerprint codes 530 based on the value of the weight, with weights close to zero receiving fingerprint codes 530 of relatively few bits, and weights further from zero receiving fingerprint codes 530 with increasing numbers of bits.

In the above example, the predictive error of the model is minimized for a given number of bits (e.g., for a given bit budget). However, in various other examples, the storage space of the compressed model may be minimized subject to the predictive error of the model being less than a specified tolerance level. Accordingly, the predictive error and the amount of compression may be adjusted according to the particular implementation.

For a given input feature that was not part of the original NLU model, minimal perfect hash function 312 may generate a random index value (random in the sense that the input feature does not correspond to any features of the original NLU model for which the perfect hash table was generated). If the index value is associated with a weight that is close to zero, only a few bits may have been used for the fingerprint code for that weight (e.g., according to an optimization problem such as the one described above). Accordingly, there is a greater chance of error. For example, for a weight that is close to zero, a single bit may be used for a fingerprint code. Accordingly, there is a 50% chance that the calculated 1-bit fingerprint code for the input feature will match the 1-bit fingerprint code stored in association with the index/quantized weight value. However, even assuming that the fingerprint codes match and the quantized weight value is returned and used during prediction (e.g., a false-positive scenario), the overall impact on prediction will be low, as the weight value returned from memory was close to zero.

In another example, if a weight has a relatively large magnitude (e.g., −13.2, 10, 5, etc.) 10 bits (or another suitable number) may be used for a fingerprint code according to an optimization such as that described above. In this example, there is a $\frac{1}{2^{10}}$ probability that the calculated 10-bit fingerprint code for the input feature will match the 10-bit fingerprint code stored in memory (assuming that the input feature was not part of the original model). Accordingly, the chance of such a large-magnitude weight being erroneously used during prediction is rendered exceedingly small through the allocation of a relatively large number of bits to the fingerprint code. As previously described, using a variable-length approach to encoding fingerprint codes reduces the overall memory footprint of the NLU model due to the distribution of weight values being clustered around zero. Accordingly, relatively small fingerprint codes may be used for the majority of weight values (as the majority of weight values in many NLU models are clustered around zero).

Figure 6:
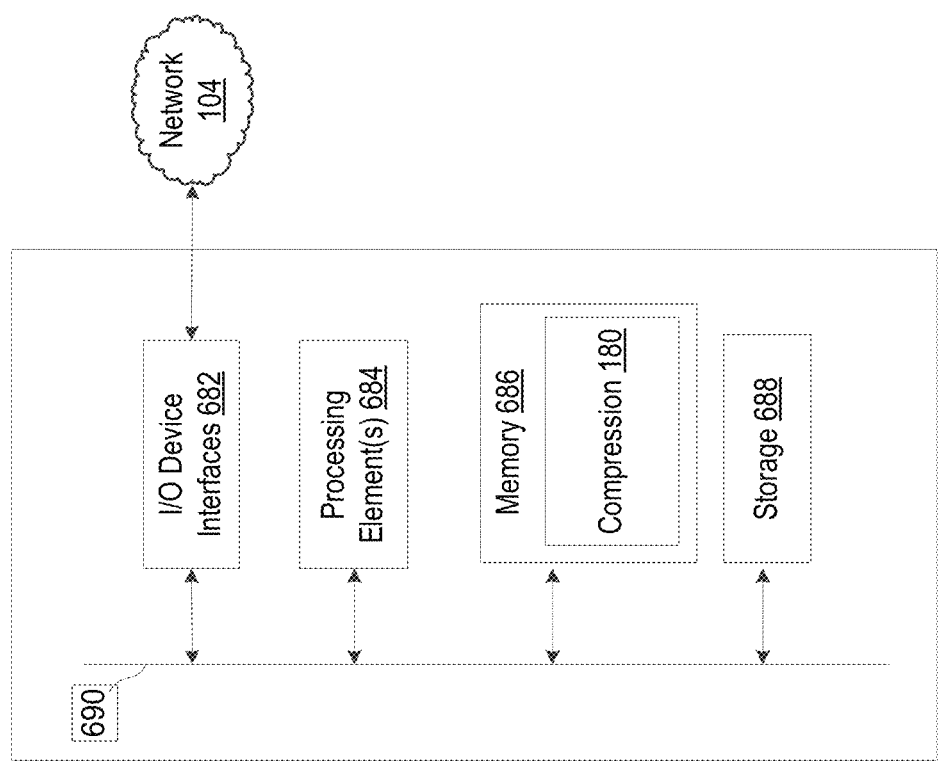
FIG. 6 is a block diagram showing an example architecture of computing devices that may be used in accordance with various embodiments described herein.

FIG. 6 is a block diagram conceptually illustrating example components of a computing device, such as the speech-processing computing device(s) 120 and/or another computing device(s) performing compression of natural language processing model 180. In operation, each of these devices (or groups of devices) may include computer-readable and computer-executable instructions that reside on the respective device, as will be discussed further below.

Each computing device may include one or more controllers/processors 684, which may each include at least one central processing unit (CPU) for processing data and computer-readable instructions, and a memory 686 for storing data and instructions of the respective device. In at least some examples, memory 686 may store, for example, instructions effective to perform the various compression techniques described herein. Additionally, in various examples, compressed NLU models compressed using the various techniques described herein may be stored in memory 686. In various further examples, memory 686 may be effective to store instructions effective to program controllers/processors 684 to perform the various techniques described above in reference to FIGS. 1-5. Accordingly, in FIG. 6, compression of natural language processing model 180 is depicted as being stored within memory 686. The memories 686 may individually include volatile random access memory (RAM), non-volatile read only memory (ROM), non-volatile magnetoresistive memory (MRAM), and/or other types of memory. Each device may also include a data storage component 688 for storing data and controller/processor-executable instructions. Each data storage component 688 may individually include one or more non-volatile storage types such as magnetic storage, optical storage, solid-state storage, etc. Each device may also be connected to removable or external non-volatile memory and/or storage (such as a removable memory card, memory key drive, networked storage, etc.) through respective input/output device interfaces 682.

Computer instructions for operating each device and its various components may be executed by the respective device's controllers/processors 684, using the memory 686 as temporary "working" storage at runtime. A device's computer instructions may be stored in a non-transitory manner in non-volatile memory 686 (e.g., a non-transitory computer-readable memory), storage 688, or an external device(s). Alternatively, some or all of the executable instructions may be embedded in hardware or firmware on the respective device in addition to or instead of software.

Each device may include input/output device interfaces 682. A variety of components may be connected through the input/output device interfaces 682, as will be discussed further below. Additionally, each device may include an address/data bus 690 for conveying data among components of the respective device. Each component within a device may also be directly connected to other components in addition to (or instead of) being connected to other components across the bus 690.

As noted above, multiple devices may be employed in a single system. In such a multi-device system, each of the devices may include different components for performing different aspects of the system's processing. The multiple devices may include overlapping components. The components of the speech-processing computing device(s) 120, as described herein, are exemplary, and may be located as a stand-alone device or may be included, in whole or in part, as a component of a larger device or system.

Figure 7:
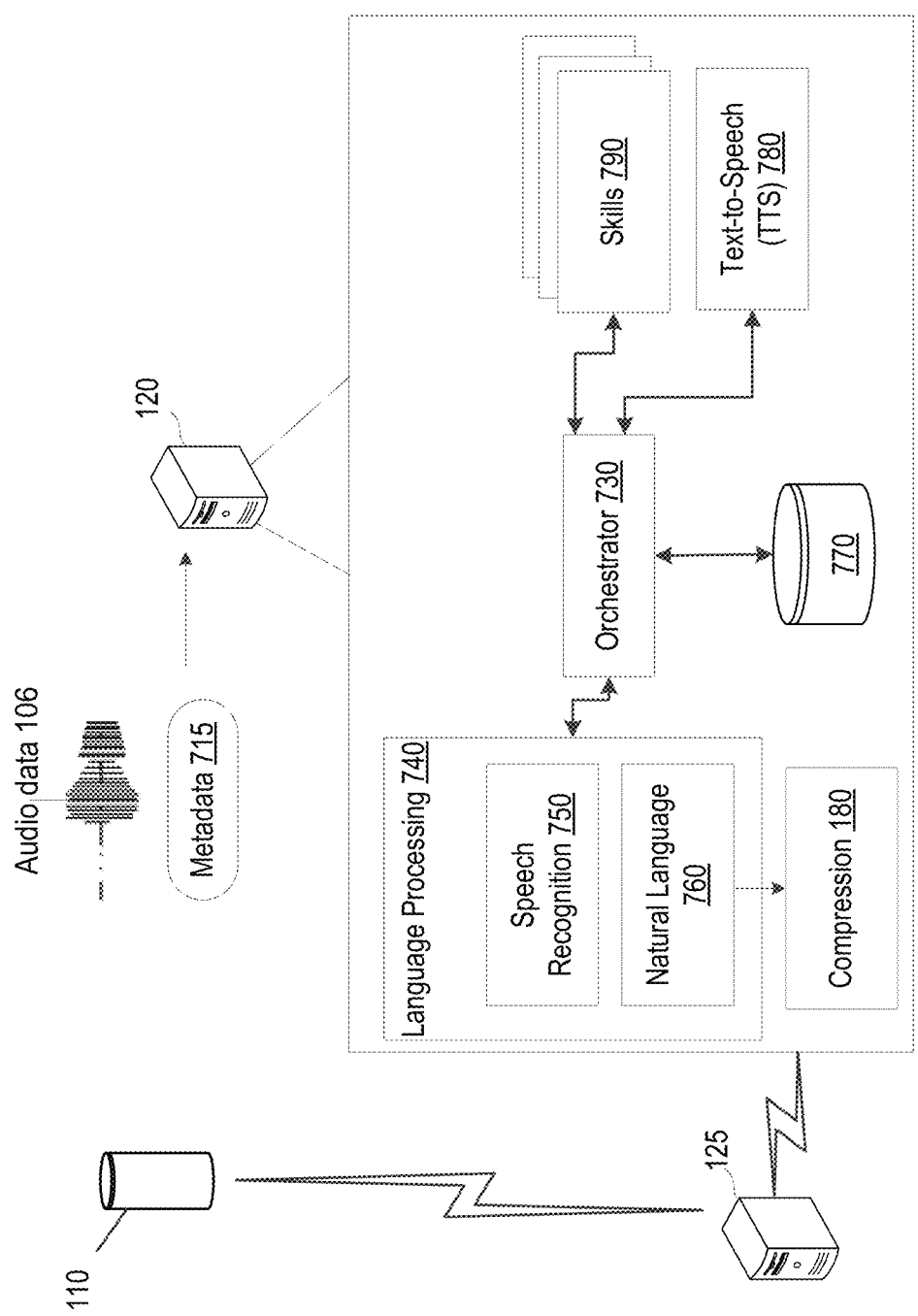
FIG. 7 is a conceptual diagram of components of a speech-processing device(s) according to various embodiments of the present disclosure.

A system according to the present disclosure may operate using various components as described in FIG. 7. The various components illustrated FIG. 7 may be located on the same or different physical devices. Communication between various components illustrated in FIG. 7 may occur directly or across a network 104. The speech-processing enabled device 110 may capture audio using an audio capture component. The speech-processing enabled device 110 may send audio data 106 (e.g., representing a spoken user request), corresponding to spoken audio, to the speech-processing computing device(s) 120. The speech-processing enabled device 110 may include a wakeword detection component that detects when input audio includes a spoken wakeword. In some instances, the speech-processing enabled device 110 may be configured to send audio data 106 to the speech-processing computing device(s) 120 when the speech-processing enabled device 110 detects a spoken wakeword. The speech-processing enabled device 110 may also send metadata 715 (e.g., including encoded states of speech-processing enabled device 110, timestamp data, etc.) to the speech-processing computing device(s) 120. The metadata 715 may be created by a computing component of the speech-processing enabled device 110.

Upon receipt by the speech-processing computing device(s) 120, the audio data 106 may be sent to an orchestrator 730. The orchestrator 730 may include memory and logic that enables the orchestrator 730 to transmit various pieces and forms of data to various components of the system. For example, orchestrator 730 may send NLU data to be compressed according to compression of natural language processing model 180.

The orchestrator 730 may send the audio data 106 to a language processing component 740. An ASR component 750 (e.g., a speech recognition component) of the language processing component 740 transcribes the audio data 106 into one or more hypotheses representing speech contained in the audio data 106. The ASR component 750 interprets the speech in the audio data based on a similarity between the characteristics of the audio data corresponding to the speech and pre-established language models. For example, the ASR component 750 may compare the audio data 106 with models for sounds (e.g., subword units such as phonemes) and sequences of sounds to identify words that match the sequence of sounds in the speech represented in the audio data 106. The ASR component 750 may send text data generated thereby to a Natural language component 760 of the language processing component 740. The text data output by the ASR component 750 may include a top scoring hypothesis of the speech represented in the audio data 106 or may include an N-best list including a group of hypotheses of the speech represented in the audio data 106, and potentially respective scores ASR processing confidence scores.

The natural language component 760 attempts to make a semantic interpretation of the phrases or statements represented in the text data input therein. That is, the natural language component 760 determines one or more meanings associated with the phrases or statements represented in the text data based on individual words represented in the text data. The natural language component 760 interprets a text string to derive an intent of the user (e.g., an action that the user desires be performed) as well as pertinent pieces of information in the text data that allow a device (e.g., the speech-processing computing device(s) 120, the skill computing device(s) 125, etc.) to complete the intent. For example, if the text data corresponds to "Play the new album by [Musical Artist]", the natural language component 760 may determine the user intended to invoke a music playback intent with to play the relevant album. In various examples, the metadata 715 may be an indication of data displayed and/or output by speech-processing enabled device 110 and/or data related to a current device state of speech-processing enabled device 110. In various examples, the natural language component 760 may be compressed using the various compression techniques described herein. In at least some other examples, natural language component 760 may represent a compressed NLU model, compressed according to one or more of the various techniques described herein.

The speech-processing computing device(s) 120 may include a profile storage 770. The profile storage 770 may include a variety of information related to individual users, groups of users, etc. that interact with the system. The user profile storage 770 may include one or more profiles. Each profile may be associated with a different identifier (ID), such as an identifier of speech-processing enabled device 110. A profile may be an umbrella profile specific to a group of users. That is, a profile encompasses two or more individual user profiles, each associated with a respective unique user ID. For example, a profile may be a household profile that encompasses user profiles associated with multiple users of a single household. Similarly, a profile may be associated with two or more users of a household and other speech-processing enabled devices of those users. A profile may include preferences shared by all the user profiles encompassed thereby. Each user profile encompassed under a single profile may include preferences specific to the user associated therewith. That is, each user profile may include preferences unique from one or more other user profiles encompassed by the same profile. A user profile may be a stand-alone profile or may be encompassed under a customer profile. As illustrated, the user profile storage 770 is implemented as part of the speech-processing computing device(s) 120. However, it should be appreciated that the user profile storage 770 may be located proximate to the speech-processing computing device(s) 120, or may otherwise be in communication with the speech-processing computing device(s) 120, for example over the network(s) 104.

The speech-processing computing device(s) 120 may include one or more skills 790 configured to perform the various techniques herein disclosed, as well as other, processes. The speech-processing computing device(s) 120 may also be in communication with one or more skill computing device(s) 125 that execute one or more skills configured to perform the herein disclosed, as well as other, processes. To enable a skill 790 to execute, orchestrator 730 may send output from the Natural language component 760 (e.g., text data including tags attributing meaning to the words and phrases represented in the text data), and optionally output from the profile storage 770 to the skill 790.

The speech-processing computing device(s) 120 may also include a TTS component 780 that synthesizes speech (e.g., generates audio data) corresponding to text data input therein. The TTS component 780 may perform speech synthesis using one or more different methods. In one method of synthesis called unit selection, the TTS component 780 matches text data against one or more databases of recorded speech. Matching units are selected and concatenated together to form audio data. In another method of synthesis called parametric synthesis, the TTS component 780 varies parameters such as frequency, volume, and noise to create an artificial speech waveform output. Parametric synthesis uses a computerized voice generator, sometimes called a vocoder.

The various components (730/740/750/760/780/790) described above may exist in software, hardware, firmware, or some combination thereof.

In some examples, the speech-processing computing device(s) 120 may reside on speech-processing enabled device 110, in a cloud computing environment, or some combination thereof. For example, the speech-processing enabled device 110 may include computing equipment, some portion of which is configured with all/some of the components/functionality of speech-processing computing device(s) 120 and another portion of which is configured with all/some of the components/functionality of one or more other computing devices. The speech-processing enabled device 110 may then perform a variety of functions on its own (such as when remote communications are unavailable), and/or may communicate (when capable) with the speech-processing computing device(s) 120 to perform other functions. Alternatively, all of the functionality may reside on the speech-processing enabled device 110 or remotely.

Figure 8:
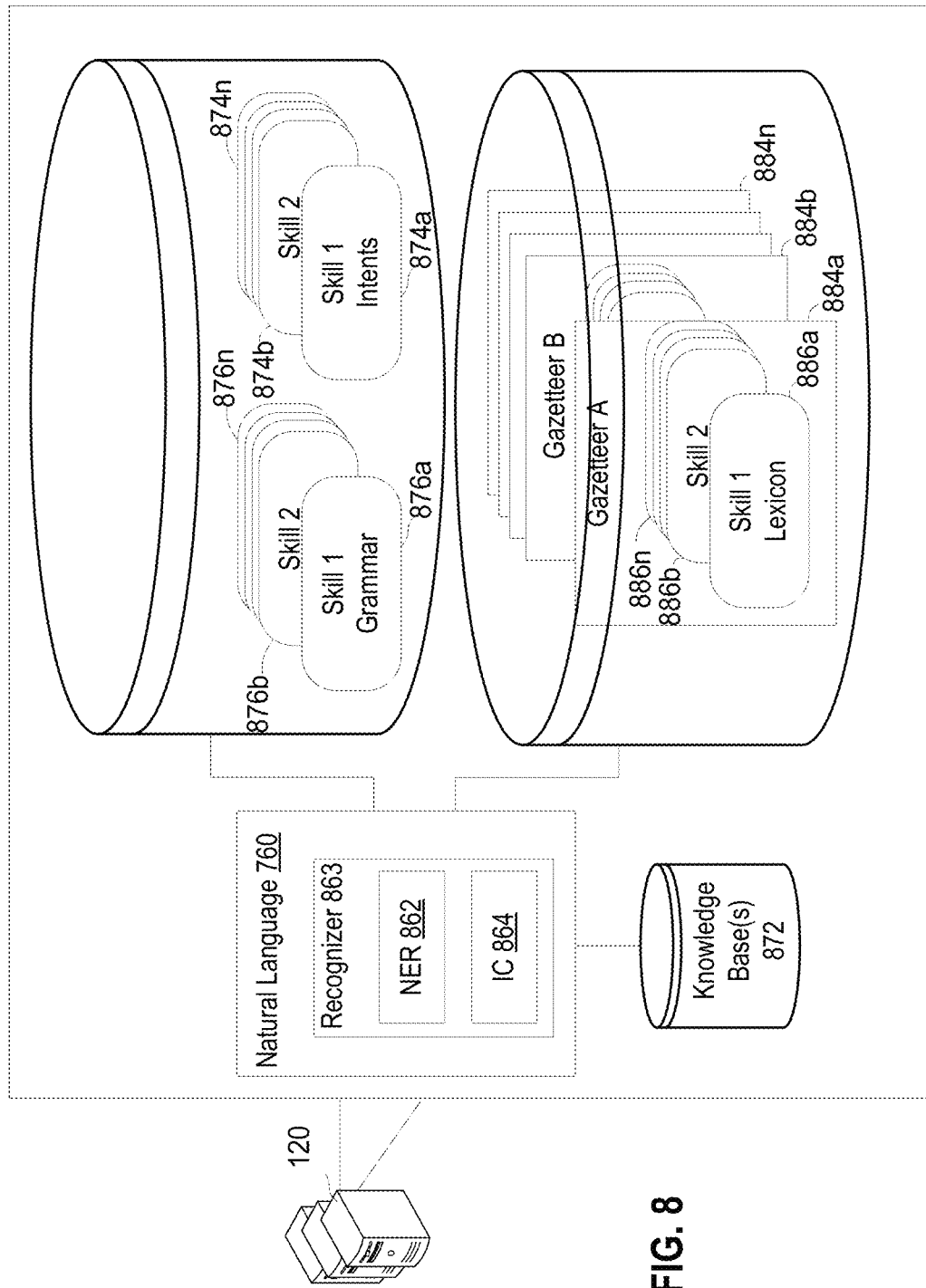
FIG. 8 is a conceptual diagram illustrating how natural language understanding processing is performed according to embodiments of the present disclosure.

FIG. 8 illustrates how NLU processing is performed on text data. Generally, the Natural language component 760 attempts to make a semantic interpretation of text data input thereto. That is, the natural language component 760 determines the meaning behind text data based on the individual words and/or phrases represented therein. The natural language component 760 interprets text data to derive an intent of the user as well as pieces of the text data that allow a device (e.g., the speech-processing enabled device 110, the speech-processing computing device(s) 120, etc.) to complete that action.

The natural language component 760 may process text data including several ASR hypotheses. The natural language component 760 may process all (or a portion of) the ASR hypotheses input therein. Even though the ASR component 750 may output multiple ASR hypotheses, the natural language component 760 may be configured to only process with respect to the top scoring ASR hypothesis.

The natural language component 760 may include one or more recognizers 863. Each recognizer 863 may be associated with a different skill 790. Each recognizer 863 may process with respect to text data input to the natural language component 760. Each recognizer 863 may operate at least partially in parallel with other recognizers 863 of the natural language component 760.

Each recognizer 863 may include a named entity recognition (NER) component 862. The NER component 862 attempts to identify grammars and lexical information that may be used to construe meaning with respect to text data input therein. The NER component 862 identifies portions of text data that correspond to a named entity that may be applicable to processing performed by a skill 790. The NER component 862 (or other component of the natural language component 760) may also determine whether a word refers to an entity whose identity is not explicitly mentioned in the text data, for example "him," "her," "it" or other anaphora, exophora or the like.

Each recognizer 863, and more specifically each NER component 862, may be associated with a particular grammar model and/or database, a particular set of intents/actions (e.g., in intents database 874), and a particular personalized lexicon 886. Each gazetteer 884 may include skill-indexed lexical information associated with a particular user and/or speech-processing enabled device 110. For example, a Gazetteer A (884*a*) includes skill-indexed lexicon 886*a* to 886*n*. A user's music skill lexical information might include album titles, artist names, and song names, for example, whereas a user's contact list skill lexical information might include the names of contacts. Since every user's music collection and contact list is presumably different, this personalized information improves entity resolution.

An NER component 862 applies grammar models 876 and lexicon 886 to determine a mention of one or more entities in text data. In this manner, the NER component 862 identifies "slots" (corresponding to one or more particular words in text data) that may be used for later processing. The NER component 862 may also label each slot with a type (e.g., noun, place, city, artist name, song name, etc.).

Each grammar model 876 includes the names of entities (i.e., nouns) commonly found in speech about the particular skill 790 to which the grammar model 876 relates, whereas the lexicon 886 is personalized to the user and/or the speech-processing enabled device 110 from which the user input originated. For example, a grammar model 876 associated with a shopping skill may include a database of words commonly used when people discuss shopping.

Each recognizer 863 may also include an intent classification (IC) component 864. An IC component 864 parses text data to determine an intent(s). An intent represents an action a user desires be performed. An IC component 864 may communicate with an intents database 874 of words linked to intents. For example, a music intent database may link words and phrases such as "quiet," "volume off," and "mute" to a <Mute> intent. An IC component 864 identifies potential intents by comparing words and phrases in text data to the words and phrases in an intents database 874.

The intents identifiable by a specific IC component 864 are linked to skill-specific grammar models 876 with "slots" to be filled. Each slot of a grammar model 876 corresponds to a portion of text data that the system believes corresponds to an entity. For example, a grammar model 876 corresponding to a <PlayMusic> intent may correspond to sentence structures such as "Play {Artist Name}," "Play {Album Name}," "Play {Song name}," "Play {Song name} by {Artist Name}," etc. However, to make resolution more flexible, grammar models 876 may not be structured as sentences, but rather based on associating slots with grammatical tags.

For example, an NER component 862 may parse text data to identify words as subject, object, verb, preposition, etc. based on grammar rules and/or models prior to recognizing named entities in the text data. An IC component 864 (e.g., implemented by the same recognizer 863 as the NER component 862) may use the identified verb to identify an intent. The NER component 862 may then determine a grammar model 876 associated with the identified intent. For example, a grammar model 876 for an intent corresponding to <PlayMusic> may specify a list of slots applicable to play the identified "object" and any object modifier (e.g., a prepositional phrase), such as {Artist Name}, {Album Name}, {Song name}, etc. The NER component 862 may then search corresponding fields in a lexicon 886, attempting to match words and phrases in text data the NER component 862 previously tagged as a grammatical object or object modifier with those identified in the lexicon 886.

An NER component 862 may perform semantic tagging, which is the labeling of a word or combination of words according to their type/semantic meaning. An NER component 862 may parse text data using heuristic grammar rules, or a model may be constructed using techniques such as hidden Markov models, maximum entropy models, log linear models, conditional random fields (CRF), and the like. For example, an NER component 862 implemented by a music recognizer may parse and tag text data corresponding to "play mother's little helper by the rolling stones" as {Verb}: "Play," {Object}: "mother's little helper," {Object Preposition}: "by," and {Object Modifier}: "the rolling stones." The NER component 862 identifies "Play" as a verb, which an IC component 864 may determine corresponds to a <PlayMusic> intent. At this stage, no determination has been made as to the meaning of "mother's little helper" and "the rolling stones," but based on grammar rules and models, the NER component 862 has determined the text of these phrases relates to the grammatical object (i.e., entity) of the user input represented in the text data.

The models linked to the intent are then used to determine what database fields should be searched to determine the meaning of these phrases, such as searching a user's gazetteer 884 for similarity with the model slots. For example, a model for a <PlayMusic> intent might indicate to attempt to resolve the identified object based on {Artist Name}, {Album Name}, and {Song name}, and another model for the same intent might indicate to attempt to resolve the object modifier based on {Artist Name}, and resolve the object based on {Album Name} and {Song Name} linked to the identified {Artist Name}. If the search of the gazetteer 884 does not resolve a slot/field using gazetteer information, the NER component 862 may search a database of generic words (e.g., in the knowledge base 872). For example, if the text data includes "play songs by the rolling stones," after failing to determine an album name or song name called "songs" by "the rolling stones," the NER component 862 may search the database for the word "songs." In the alternative, generic words may be checked before the gazetteer information, or both may be tried, potentially producing two different results.

An NER component 862 may tag text data to attribute meaning thereto. For example, an NER component 862 may tag "play mother's little helper by the rolling stones" as: {skill} Music, {intent}<PlayMusic>, {artist name} rolling stones, {media type} SONG, and {song title} mother's little helper. For further example, the NER component 862 may tag "play songs by the rolling stones" as: {skill} Music, {intent}<PlayMusic>, {artist name} rolling stones, and {media type} SONG.

Figure 9:
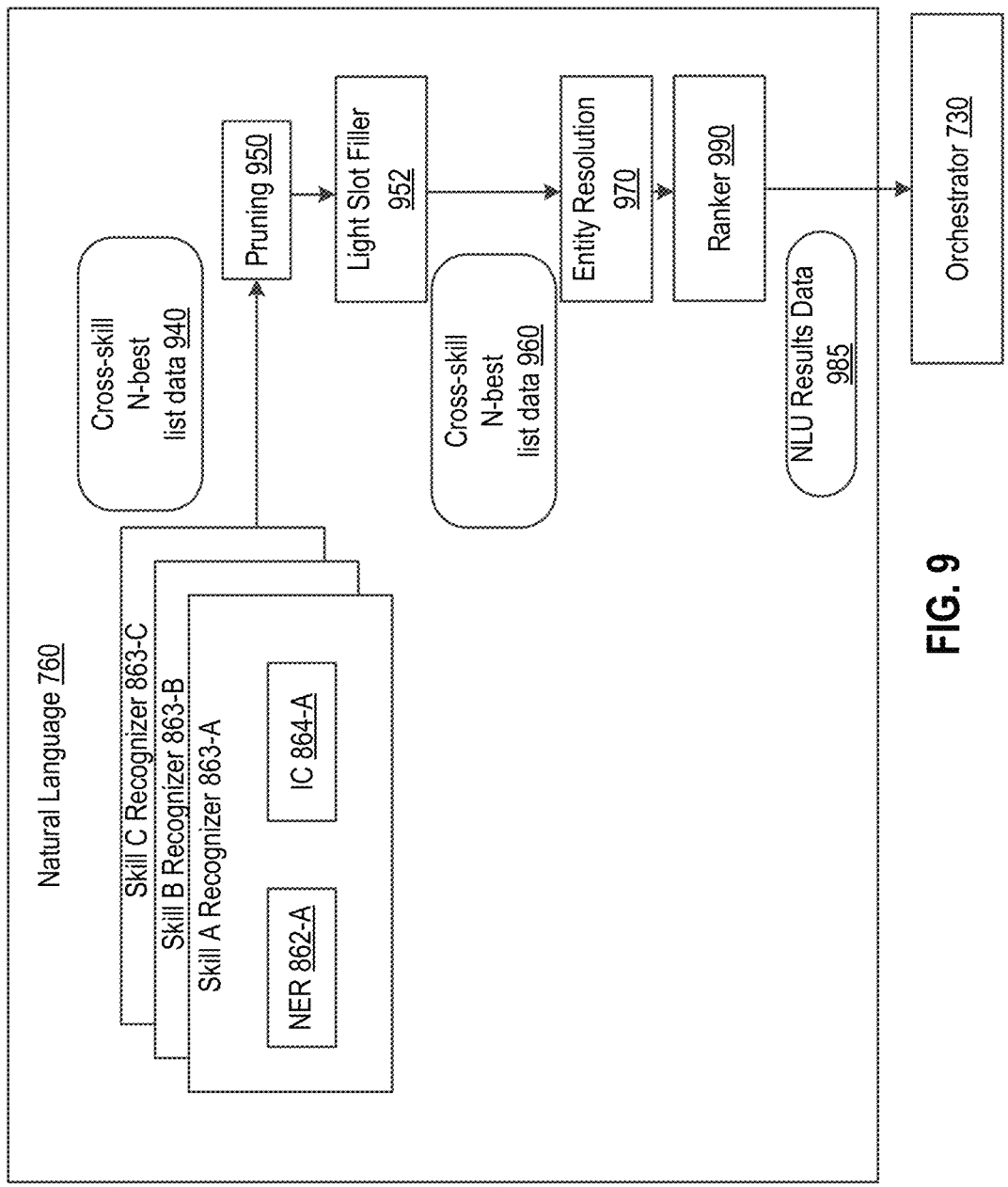
FIG. 9 is a conceptual diagram illustrating how natural language understanding processing is performed according to embodiments of the present disclosure.

The natural language component 760 may generate cross-skill N-best list data 940, which may include a list of NLU hypotheses output by each recognizer 863 (as illustrated in FIG. 9). A recognizer 863 may output tagged text data generated by an NER component 862 and an IC component 864 operated by the recognizer 863, as described above. Each NLU hypothesis including an intent indicator and text/slots may be grouped as an NLU hypothesis represented in the cross-skill N-best list data 940. Each NLU hypothesis may also be associated with one or more respective score(s) for the NLU hypothesis. For example, the cross-skill N-best list data 940 may be represented as, with each line representing a separate NLU hypothesis:

[0.95] Intent: <PlayMusic> ArtistName: Lady Gaga SongName: Poker Face

[0.95] Intent: <PlayVideo> ArtistName: Lady Gaga VideoName: Poker Face

[0.01] Intent: <PlayMusic> ArtistName: Lady Gaga AlbumName: Poker Face

[0.01] Intent: <PlayMusic> SongName: Pokerface

In various examples, the cross-skill N-best list data 940 and/or 960 may comprise the N-best Intents data—e.g., a list of N intents with the highest confidence scores among intents scored for a particular utterance). The natural language component 760 may send the cross-skill N-best list data 940 to a pruning component 950. The pruning component 950 may sort the NLU hypotheses represented in the cross-skill N-best list data 940 according to their respective scores. The pruning component 950 may then perform score thresholding with respect to the cross-skill N-best list data 940. For example, the pruning component 950 may select NLU hypotheses represented in the cross-skill N-best list data 940 associated with confidence scores satisfying (e.g., meeting and/or exceeding) a threshold confidence score. The pruning component 950 may also or alternatively perform number of NLU hypothesis thresholding. For example, the pruning component 950 may select a maximum threshold number of top scoring NLU hypotheses. The pruning component 950 may generate cross-skill N-best list data 960 including the selected NLU hypotheses. The purpose of the pruning component 950 is to create a reduced list of NLU hypotheses so that downstream, more resource intensive, processes may only operate on the NLU hypotheses that most likely represent the user's intent.

The natural language component 760 may also include a light slot filler component 952. The light slot filler component 952 can take text data from slots represented in the NLU hypotheses output by the pruning component 950 and alter it to make the text data more easily processed by downstream components. The light slot filler component 952 may perform low latency operations that do not involve heavy operations, such as those requiring reference to a knowledge base. The purpose of the light slot filler component 952 is to replace words with other words or values that may be more easily understood by downstream system components. For example, if an NLU hypothesis includes the word "tomorrow," the light slot filler component 952 may replace the word "tomorrow" with an actual date for purposes of downstream processing. Similarly, the light slot filler component 952 may replace the word "CD" with "album" or the words "compact disc." The replaced words are then included in the cross-skill N-best list data 960.

The natural language component 760 sends the cross-skill N-best list data 960 to an entity resolution component 970. The entity resolution component 970 can apply rules or other instructions to standardize labels or tokens from previous stages into an intent/slot representation. The precise transformation may depend on the skill 790. For example, for a travel skill, the entity resolution component 970 may transform text data corresponding to "Seattle airport" to the standard SEA three-letter code referring to the airport. The entity resolution component 970 can refer to a knowledge base that is used to specifically identify the precise entity referred to in each slot of each NLU hypothesis represented in the cross-skill N-best list data 960. Specific intent/slot combinations may also be tied to a particular source, which may then be used to resolve the text data. In the example "play songs by the stones," the entity resolution component 970 may reference a personal music catalog, Amazon Music account, user profile data, or the like. The entity resolution component 970 may output text data including an altered N-best list that is based on the cross-skill N-best list data 960, and that includes more detailed information (e.g., entity IDs) about the specific entities mentioned in the slots and/or more detailed slot data that can eventually be used by downstream components to perform an action responsive to the user input. The natural language component 760 may include multiple entity resolution components 970 and each entity resolution component 970 may be specific to one or more skills 790.

The entity resolution component 970 may not be successful in resolving every entity and filling every slot represented in the cross-skill N-best list data 960. This may result in the entity resolution component 970 outputting incomplete results.

The natural language component 760 may include a ranker component 990. The ranker component 990 may assign a particular confidence score to each NLU hypothesis input therein. The confidence score of an NLU hypothesis may represent a confidence of the system in the NLU processing performed with respect to the NLU hypothesis. The confidence score of a particular NLU hypothesis may be affected by whether the NLU hypothesis has unfilled slots. For example, if an NLU hypothesis associated with a first skill includes slots that are all filled/resolved, that NLU hypothesis may be assigned a higher confidence score than another NLU hypothesis including at least some slots that are unfilled/unresolved by the entity resolution component 970.

The ranker component 990 may apply re-scoring, biasing, and/or other techniques to determine the top scoring NLU hypotheses. To do so, the ranker component 990 may consider not only the data output by the entity resolution component 970, but may also consider other data such as skill 790 rating or popularity data. For example, if one skill 790 has a particularly high rating, the ranker component 990 may increase the score of an NLU hypothesis associated with that skill 790, and vice versa. The other data may include information about skills 790 that have been enabled for the user identifier and/or device identifier associated with the current user input. For example, the ranker component 990 may assign higher scores to NLU hypotheses associated with enabled skills 790 than NLU hypotheses associated with non-enabled skills 790. The other data may include data indicating user usage history, such as if the user identifier associated with the current user input is regularly associated with user inputs that invoke a particular skill 790 or does so at particular times of day. The other data may include data indicating date, time, location, weather, type of speech-processing enabled device 110, user identifier, device identifier, context, as well as other information. For example, the ranker component 990 may consider when any particular skill 790 is currently active (e.g., music being played, a game being played, etc.) with respect to the user or speech-processing enabled device 110 associated with the current user input. The other data may include device type information. For example, if the speech-processing enabled device 110 does not include a display, the ranker component 990 may decrease the score associated with an NLU hypothesis that would result in displayable content being presented to a user, and vice versa.

Following ranking by the ranker component 990, the natural language component 760 may output NLU results data 985 to the orchestrator 730. The NLU results data 985 may include a ranked list of the top scoring NLU hypotheses as determined by the ranker component 990. Alternatively, the NLU results data 985 may include the top scoring NLU hypothesis as determined by the ranker component 990.

The orchestrator 730 may select a skill 790, based on the NLU results data 885, for performing an action responsive to the user input. In an example, the orchestrator 730 may send all (or a portion of) the NLU results data 985 to a skill 790 that is represented in the NLU results data 985 and to be invoked to perform an action responsive to the user input.

The compression techniques described above in reference to FIGS. 1-5 may be used to generate compressed representations of the natural language processing systems (e.g., NLU models) described in reference to FIGS. 7-9.

Figure 10:
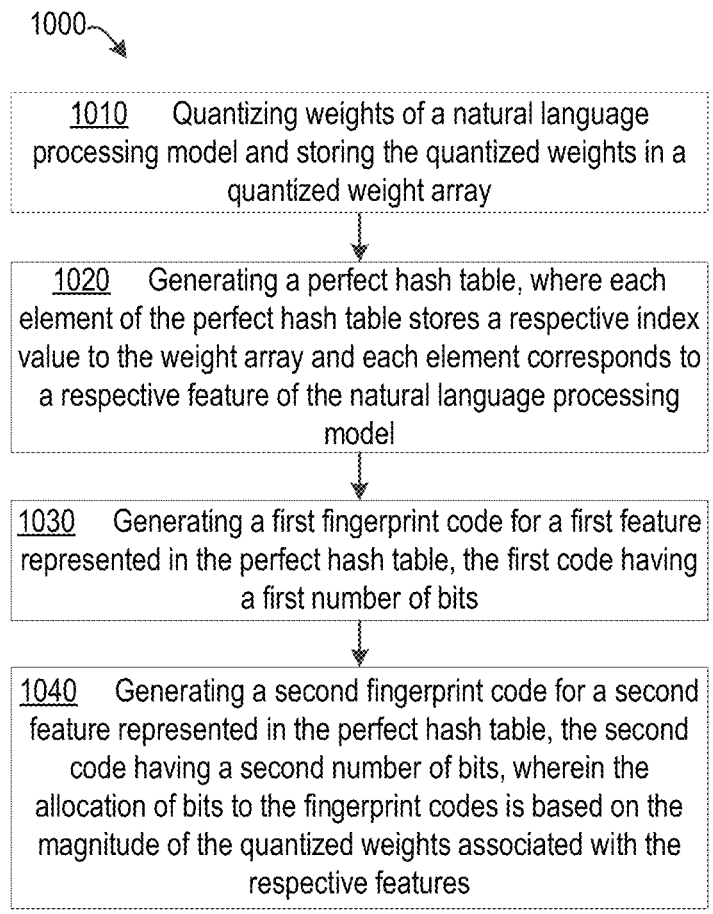
FIG. 10 depicts a flow chart showing an example process for compressing a natural language processing model, in accordance with various aspects of the present disclosure.

FIG. 10 depicts a flow chart showing an example process 1000 for compressing a natural language processing model, in accordance with various aspects of the present disclosure. Those portions of FIG. 10 that have been previously discussed in reference to FIGS. 1-9 may not be described again for purposes of clarity and brevity. The actions of the process 1000 may represent a series of instructions comprising computer-readable machine code executable by one or more processing units of one or more computing devices. In various examples, the computer-readable machine codes may be comprised of instructions selected from a native instruction set of and/or an operating system (or systems) of the one or more computing devices. Although the figures and discussion illustrate certain operational steps of the system in a particular order, the steps described may be performed in a different order (as well as certain steps removed or added) without departing from the intent of the disclosure.

In some examples, process 1000 may begin at action 1010, "Quantizing weights of a natural language processing model and storing the quantized weights in a quantized weight array". At action 1010, weights of the natural language processing model being compressed may be represented by a subset of quantized weights, wherein each quantized weight may be representative of a cluster of weight values from the original, uncompressed natural language processing model (sometimes referred to herein as an "uncompressed natural language model").

Process 1000 may continue from action 1010 to action 1020, "Generating a perfect hash table, where each element of the perfect hash table stores a respective index value to the weight array, and each element corresponds to a respective feature of the natural language processing model". Perfect hashing may be used to represent each element of a natural language processing model in a perfect hash table. Instead of storing features explicitly in the perfect hash table, each element of the perfect hash table may instead store a respective index value to a weight associated with the feature represented by the element of the perfect hash table.

Processing may continue from action 1020 to action 1030, "Generating a first fingerprint code for a first feature represented in the perfect hash table, the first code having a first number of bits". In various examples, fingerprint codes may be generated for each feature represented by the perfect hash table. Fingerprint codes may be stored in association with the elements of the perfect hash table, and may correspond to their respective features.

Processing may continue from action 1030 to action 1040, "Generating a second fingerprint code for a second feature represented in the perfect hash table, the second code having a second number of bits, wherein the allocation of bits to the fingerprint codes is based on the magnitude of the quantized weights associated with the respective features". In various examples, bit allocation for fingerprint codes identifying features may be based on magnitudes of weights corresponding to those features. In general, fingerprint codes for features associated with lower magnitude weights (e.g., weights within $+/-\sigma$) may comprise fewer bits relative to fingerprint codes for features associated with higher magnitude weights (e.g., weights $w-\sigma<$ and $w>\sigma$).

Although various systems described herein may be embodied in software or code executed by general purpose hardware as discussed above, as an alternate the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those of ordinary skill in the art and consequently, are not described in detail herein.

The flowcharts and methods described herein show the functionality and operation of various implementations. If embodied in software, each block or step may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processing component in a computer system. If embodied in hardware, each block may represent a circuit or a number of interconnected circuits to implement the specified logical function(s).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

Also, any logic or application described herein that comprises software or code can be embodied in any non-transitory computer-readable medium or memory for use by or in connection with an instruction execution system such as a processing component in a computer system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as magnetic, optical, or semiconductor media. More specific examples of a suitable computer-readable media include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described example(s) without departing substantially from the spirit and principles of the disclosure. All such modifications and variations are intended to be included herein within the scope of this disclosure and protected by the following claims.

What is claimed is:

1. A method of generating a compressed natural language model, the method comprising:
 determining a plurality of quantized weight values from weights of a natural language model, wherein the plurality of quantized weight values includes a first quantized weight value representing an average value of a first set of the weights;
 storing the plurality of quantized weight values in a quantized weight table, wherein the first quantized weight value is stored at a first address in the quantized weight table and a second quantized weight value of the plurality of quantized weight values is stored at a second address in the quantized weight table;
 generating, using a minimal perfect hash function, a perfect hash table comprising:
  a first portion of memory associated with a first feature of the natural language model, the first portion of memory storing a first index value associated with the quantized weight table, the first index value identifying the first address storing the first quantized weight value, the first quantized weight value having a first magnitude; and
  a second portion of memory associated with a second feature of the natural language model, the second portion of memory storing a second index value associated with the quantized weight table, the second index value identifying the second address storing the second quantized weight value, the second quantized weight value having a second magnitude that is less than the first magnitude;
 generating first code data using first feature string data of the first feature, wherein the first code data identifies the first feature from among other features and comprises a first number of bits;
 storing, in association with the first portion of memory, the first code data;

generating a second code data using second feature string data of the second feature, wherein the second code data identifies the second feature from among other features and comprises a second number of bits, the second number of bits being less than the first number of bits; and storing, in association with the second portion of memory, the second code data.

2. The method of claim 1, further comprising:

determining that a majority of the weights of the natural language model are within one standard deviation of zero;

determining, using Huffman encoding, a first prefix code for the first index value, wherein storing the first index value in the first portion of memory of the perfect hash table comprises storing the first prefix code in the first portion of memory; and determining, using Huffman encoding, a second prefix code for the second index value, wherein storing the second index value in the second portion of memory of the perfect hash table comprises storing the second prefix code in the second portion of memory, wherein a third number of bits of the second prefix code is fewer than a fourth number of bits of the first prefix code based on the second quantized weight value being used more frequently than the first quantized weight value by the compressed natural language model.

3. The method of claim 1, further comprising:

receiving, by at least one computing device, a request for a weight value associated with first feature string data, wherein the first feature string data is undefined with respect to the compressed natural language model;

generating a third code data for the first feature string data;

generating an index associated with the second portion of memory of the perfect hash table by inputting the first feature string data into the minimal perfect hash function;

determining the second code data;

determining that the second code data differs from the third code data; and determining that the weight value associated with the first feature string data is zero.

4. A method comprising:

generating, using a hash function, a hash table, wherein a first element of the hash table is associated with a first feature of a machine learned model and a second element of the hash table is associated with a second feature of the machine learned model;

storing first data in the hash table, the first data representing where a first weight is stored in a weight table, the first weight associated with the first feature;

storing second data in the hash table, the second data representing where a second weight is stored in the weight table, the second weight associated with the second feature of the machine learned model;

generating a first identifying data associated with the first feature, the first identifying data identifying the first feature from among other features of the machine learned model, wherein the first identifying data comprises a first number of bits based at least in part on the first weight;

generating a second identifying data associated with the second feature, the second identifying data identifying the second feature from among the other features of the machine learned model, wherein the second identifying data comprises a second number of bits greater than the first number of bits, wherein the second number of bits is based at least in part on the second weight; and storing the hash table in a non-transitory computer-readable memory.

5. The method of claim 4, further comprising:

determining a first number of occurrences of the first data in the hash table;

determining a second number of occurrences of the second data in the hash table, wherein the first number of occurrences is greater than the second number of occurrences;

encoding the first data with a first prefix code having a third number of bits; and encoding the second data with a second prefix code having a fourth number of bits, wherein the third number of bits is less than the fourth number of bits.

6. The method of claim 4, further comprising:

determining a plurality of quantized weights for the machine learned model, wherein the plurality of quantized weights includes a first quantized weight value representing first weights of the machine learned model and a second quantized weight value representing second weights of the machine learned model; and storing the plurality of quantized weights in the weight table, wherein the first weight corresponds to the first quantized weight value and the second weight corresponds to the second quantized weight value.

7. The method of claim 6, further comprising:

determining a minimum weight value of the machine learned model;

determining a maximum weight value of the machine learned model;

determining a set of evenly spaced clusters between the minimum weight value and the maximum weight value;

determining the first quantized weight value for a first cluster of the set of evenly spaced clusters; and determining the second quantized weight value for a second cluster of the set of evenly spaced clusters.

8. The method of claim 4, wherein the first identifying data is a first variable length fingerprint code and the second identifying data is a second variable length fingerprint code, the method further comprising:

determining a first bit allocation for the first variable length fingerprint code by solving an optimization problem; and determining a second bit allocation for the second variable length fingerprint code by solving the optimization problem, wherein the first bit allocation is different from the second bit allocation.

9. The method of claim 4, further comprising:

receiving a request for a weight associated with a third feature, wherein the third feature is undefined with respect to the machine learned model;

generating, by a first function, third identifying data for the third feature;

generating an index to the hash table by inputting the third feature into the hash function;

determining the first identifying data associated with the first feature;

determining that the third identifying data matches the first identifying data; and determining that the weight associated with the third feature is the first weight.

10. The method of claim 4, further comprising:

receiving a request for a weight associated with a third feature, wherein the third feature is undefined with respect to the machine learned model;

generating, by a first function, third identifying data for the third feature;

generating an index to the second element of the hash table by inputting the third feature into the hash function;

determining the second identifying data associated with the second feature;

determining that the third identifying data differs from the second identifying data; and determining that the weight associated with the third feature is zero.

11. The method of claim 4, further comprising:

receiving audio data representing user utterance;

determining, by an speech recognition component, text data from the audio data;

determining feature data represented in the text data;

determining, for the feature data, the first data, by inputting the feature data into the hash function;

performing a lookup operation on the weight table using the first data, wherein the lookup operation returns the first weight;

sending the feature data and the first weight to a compressed machine learned model; and determining, based at least in part on the first weight and the feature data, that the user utterance invokes a first speech-processing domain.

12. The method of claim 4, further comprising:

generating the first identifying data comprising the first number of bits and the second identifying data comprising the second number of bits based at least in part on a first magnitude of the first weight being less than a second magnitude of the second weight.

13. A system, comprising:

at least one processor; and at least one non-transitory computer-readable memory storing instructions that, when executed by the at least one processor, programs the at least one processor to perform a method comprising:

generating, using a hash function, a hash table, wherein a first element of the hash table is associated with a first feature of a machine learned model and a second element of the hash table is associated with a second feature of the machine learned model;

storing first data in the hash table, the first data representing where a first weight is stored in a weight table, the first weight associated with the first feature;

storing second data in the hash table, the second data representing where a second weight is stored in the weight table, the second weight associated with the second feature of the machine learned model;

generating a first identifying data associated with the first feature, the first identifying data identifying the first feature from among other features of the machine learned model, wherein the first identifying data comprises a first number of bits based at least in part on the first weight;

generating a second identifying data associated with the second feature, the second identifying data identifying the second feature from among the other features of the machine learned model, wherein the second identifying data comprises a second number of bits greater than the first number of bits, wherein the second number of bits is based at least in part on the second weight; and storing the hash table in the at least one non-transitory computer-readable memory.

14. The system of claim 13, wherein the instructions, when executed by the at least one processor, are effective to program the at least one processor to perform the method further comprising:

determining a first number of occurrences of the first data in the hash table;

determining a second number of occurrences of the second data in the hash table, wherein the first number of occurrences is greater than the second number of occurrences;

encoding the first data with a first prefix code having a third number of bits; and encoding the second data with a second prefix code having a fourth number of bits, wherein the third number of bits is less than the fourth number of bits.

15. The system of claim 13, wherein the instructions, when executed by the at least one processor, are effective to program the at least one processor to perform the method further comprising:

determining a plurality of quantized weights for the machine learned model, wherein the plurality of quantized weights includes a first quantized weight value representing first weights of the machine learned model and a second quantized weight value representing second weights of the machine learned model; and storing the plurality of quantized weights in the weight table, wherein the first weight corresponds to the first quantized weight value and the second weight corresponds to the second quantized weight value.

16. The system of claim 15, wherein the instructions, when executed by the at least one processor, are effective to program the at least one processor to perform the method further comprising:

determining a minimum weight value of the machine learned model;

determining a maximum weight value of the machine learned model;

determining a set of evenly spaced clusters between the minimum weight value and the maximum weight value;

determining the first quantized weight value for a first cluster of the set of evenly spaced clusters; and determining the second quantized weight value for a second cluster of the set of evenly spaced clusters.

17. The system of claim 13, wherein the first identifying data is a first variable length fingerprint code and the second identifying data is a second variable length fingerprint code, and wherein the instructions, when executed by the at least one processor, are effective to program the at least one processor to perform the method further comprising:

determining a first bit allocation for the first variable length fingerprint code by solving an optimization problem; and determining a second bit allocation for the second variable length fingerprint code by solving the optimization problem, wherein the first bit allocation is different from the second bit allocation.

18. The system of claim 13, wherein the instructions, when executed by the at least one processor, are effective to program the at least one processor to perform the method further comprising:

receiving a request for a weight associated with a third feature, wherein the third feature is undefined with respect to the machine learned model;

generating, by a first function, third identifying data for the third feature;

generating an index to the hash table by inputting the third feature into the hash function;

determining the first identifying data associated with the first feature;

determining that the third identifying data matches the first identifying data; and determining that the weight associated with the third feature is the first weight.

19. The system of claim 13, wherein the instructions, when executed by the at least one processor, are effective to program the at least one processor to perform the method further comprising:

receiving a request for a weight associated with a third feature, wherein the third feature is undefined with respect to the machine learned model;

generating, by a first function, third identifying data for the third feature;

generating an index to the second element of the hash table by inputting the third feature into the hash function;

determining the second identifying data associated with the second feature;

determining that the third identifying data differs from the second identifying data; and determining that the weight associated with the third feature is zero.

20. The system of claim 13, wherein the instructions, when executed by the at least one processor, are effective to program the at least one processor to perform the method further comprising:

generating the first identifying data comprising the first number of bits and the second identifying data comprising the second number of bits based at least in part on a first magnitude of the first weight being less than a second magnitude of the second weight.

* * * * *